(12) United States Patent
Guterman et al.

(10) Patent No.: US 7,518,928 B2
(45) Date of Patent: Apr. 14, 2009

(54) EFFICIENT VERIFICATION FOR COARSE/FINE PROGRAMMING OF NON VOLATILE MEMORY

(75) Inventors: Daniel C. Guterman, Fremont, CA (US); Nima Mokhlesi, Los Gatos, CA (US); Yupin Fong, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/550,499

(22) Filed: Oct. 18, 2006

(65) Prior Publication Data

US 2007/0058436 A1   Mar. 15, 2007

Related U.S. Application Data

(62) Division of application No. 10/766,217, filed on Jan. 27, 2004, now Pat. No. 7,139,198.

(51) Int. Cl.
*G11C 16/10* (2006.01)
*G11C 16/26* (2006.01)

(52) U.S. Cl. .................. 365/185.22; 365/189.04; 365/185.03; 365/185.21; 365/185.24

(58) Field of Classification Search ............ 365/185.03, 365/185.11, 185.21, 185.22, 230.03, 189.04, 365/185.24
See application file for complete search history.

(56) References Cited

U.S. PATENT DOCUMENTS

| | | | |
|---|---|---|---|
| 5,220,531 A | 6/1993 | Blyth | |
| 5,313,421 A | 5/1994 | Guterman | |
| 5,412,601 A | 5/1995 | Sawada | |
| 5,521,865 A | 5/1996 | Ohuchi | |
| 5,570,315 A | 10/1996 | Tanaka | |
| 5,652,719 A | 7/1997 | Tanaka | |
| 5,712,180 A | 1/1998 | Guterman | |
| 5,712,815 A | 1/1998 | Bill | |
| 5,761,222 A | 6/1998 | Baldi | |
| 5,870,344 A | 2/1999 | Ozawa | |
| 5,880,993 A | 3/1999 | Kramer et al. | |
| 5,926,409 A | 7/1999 | Engh | |
| 5,949,714 A | 9/1999 | Hemink | |
| 5,969,986 A | 10/1999 | Wong | |
| 6,151,248 A | 11/2000 | Harari | |

(Continued)

FOREIGN PATENT DOCUMENTS

EP    1249842    10/2002

OTHER PUBLICATIONS

Kurata, Hideaki, et al., Constant-Charge-Injection Programming for 10-MB/s Multilevel AG-AND Flash Memories, 2002 Symposium On VLSI Circuits Digest of Technical Papers, pp. 302-303.

(Continued)

*Primary Examiner*—J. H. Hur
(74) *Attorney, Agent, or Firm*—Vierra Magen Marcus & DeNiro LLP

(57) ABSTRACT

A non-volatile memory device is programmed by first performing a coarse programming process and subsequently performing a fine programming process. The coarse/fine programming methodology is enhanced by using an efficient verification scheme that allows some non-volatile memory cells to be verified for the coarse programming process while other non-volatile memory cells are verified for the fine programming process. The fine programming process can be accomplished using current sinking, charge packet metering or other suitable means.

27 Claims, 16 Drawing Sheets

U.S. PATENT DOCUMENTS

| | | |
|---|---|---|
| 6,222,762 B1 | 4/2001 | Guterman |
| 6,243,290 B1 | 6/2001 | Kurata |
| 6,266,270 B1 | 7/2001 | Nobukata |
| 6,278,634 B1 | 8/2001 | Ra |
| 6,301,161 B1 | 10/2001 | Holzmann |
| 6,317,364 B1 | 11/2001 | Guterman |
| 6,392,931 B1 | 5/2002 | Pasotti et al. |
| 6,424,566 B1 | 7/2002 | Parker |
| 6,522,580 B2 | 2/2003 | Chen |
| 6,525,964 B2 | 2/2003 | Tanaka |
| 6,529,412 B1 | 3/2003 | Chen |
| 6,532,172 B2 | 3/2003 | Harari |
| 6,597,603 B2 | 7/2003 | Lambrache et al. |
| 6,643,188 B2 | 11/2003 | Tanaka et al. |
| 6,788,579 B2 | 9/2004 | Gregori et al. |
| 7,002,843 B2 | 2/2006 | Guterman et al. |
| 7,068,539 B2 | 6/2006 | Guterman et al. |
| 7,139,198 B2 | 11/2006 | Guterman et al. |
| 7,224,760 B1 | 5/2007 | Rokhsaz et al. |
| 7,317,638 B2 | 1/2008 | Guterman et al. |
| 2002/0024846 A1 | 2/2002 | Kawahara |
| 2002/0057598 A1 | 5/2002 | Sakamoto |
| 2002/0118574 A1 | 8/2002 | Gongwer |
| 2003/0147278 A1 | 8/2003 | Tanaka |

OTHER PUBLICATIONS

Johnson, William S., et al., Session XII: ROMs, PROMs and EROMs, 1980 IEEE International Solid State Circuits Conference, pp. 152-153.

Nobukata, Hiromi, et al., A 144Mb 8-Level NAND Flash Memory with Optimized Pulse Width Programming, 1999 Symposium on VLSI Circuits Digest of Technical Papers, pp. 39-40.

Ohkawa, Masayoshi, et al., TP 2.3: A 98 mm2 3.3V 64Mb Flash Memory with FN-NOR Type 4-level Cell, 1996 IEEE International Solid-State Circuits Conference, pp. 36-37.

Office Action dated Jan. 10, 2008, U.S. Appl. No. 11/280,716, filed Nov. 16, 2005.

Notice of Allowance, dated Aug. 13, 2007, U.S. Appl. No. 11/550,502, filed Oct. 18, 2006; Allowed Claims.

Response to Office Action dated Mar. 21, 2008, U.S. Appl. No. 11/280,716, filed Nov. 16, 2005.

Office Action dated Mar. 18, 2008, U.S. Appl. No. 11/429,769, filed May 8, 2006.

Response to Office Action mailed May 22, 2008, U.S. Appl. No. 11/280,716, filed Nov. 16, 2005.

Notice of Allowance mailed Jun. 5, 2008, U.S. Appl. No. 11/280,716, filed Nov. 16, 2005.

Response to Office Action dated Jun. 16, 2008, U.S. Appl. No. 11/429,769.

European Office Action dated Jul. 22, 2008 in European Patent Application No. 05711926.5.

Notice of Allowance dated Aug. 25, 2008 in U.S. Appl. No. 11/429,770.

Notice of Allowance dated Aug. 11, 2008 in U.S. Appl. No. 11/429,769.

Taiwanese Office Action dated Jul. 31, 2008 in Taiwanese Patent Application No. 094102485.

Chinese Office Action dated Nov. 3, 2008 in Chinese Patent Application No. 200580007372.6.

Fig. 8

| FUNCTION BEING PERFORMED ON CELL | SELECT GATE (WORD LINE) | LEFT BIT LINE (BL - LEFT) | LEFT STEERING GATE | RIGHT STEERING GATE | RIGHT BIT LINE (BL-RIGHT) |
|---|---|---|---|---|---|
| (1) UNSELECTED ROW | 0 | X | X | X | X |
| (2) ERASE (TO WORD LINE) | $V_E$ | 5 | 0 | 0 | 5 |
| (3) READ LEFT FLOATING GATE | $V_S$ | 0 | $V_M$ | $V_{BR}$ | 1 |
| (4) READ RIGHT FLOATING GATE | $V_R$ | 1 | $V_{BR}$ | $V_M$ | 0 |
| (5) PROGRAM LEFT FLOATING GATE | $V_{SP}$ | 5 | $V_P$ | $V_{BP}$ | 0 |
| (6) PROGRAM RIGHT FLOATING GATE | $V_{SP}$ | 0 | $V_{BP}$ | $V_P$ | 5 |
| (7) NO PROGRAM IN SELECTED ROW | $V_{SP}$ | 5 | X | X | 5 |
| (8) ERASE (TO CHANNEL) [WITH VOLTAGES OF BOTH THE p-well AND n-well EQUAL TO $V_E$, AND THE SUBSTRATE AT ZERO VOLTS] | $V_E^S$ | FLOAT | 0 | 0 | FLOAT |

EFFICIENT VERIFICATION FOR COARSE/FINE PROGRAMMING OF NON VOLATILE MEMORY

CLAIM OF PRIORITY

This application is a divisional application of U.S. patent application Ser. No. 10/766,217, "Efficient Verification for Coarse/Fine Programming of Non-Volatile Memory," by Guterman, et al., filed on Jan. 27, 2004, now U.S. Pat. No. 7,139,198, incorporated herein by reference.

CROSS-REFERENCE TO RELATED APPLICATIONS

This Application is related to the following two United States Patent Applications: "Charge Packet Metering For Coarse/Fine Programming Of Non-Volatile Memory," Daniel C. Guterman, Nima Mokhlesi and Yupin Fong, U.S. Pat. No. 7,068,539; and "Variable Current Sinking For Coarse/Fine Programming Of Non-Volatile Memory," Daniel C. Guterman, Nima Mokhlesi and Yupin Fong, U.S. Pat. No. 7,002,843. The two above-listed related applications are both incorporated herein by reference in their entirety.

BACKGROUND OF THE INVENTION

1. Field of the Invention

The present invention is directed to technology for non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory cell can be programmed/erased between two states. When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised.

Typically, the program voltage applied to the control gate is applied as a series of pulses. The magnitude of the pulses is increased with each successive pulse by a predetermined step size (e.g. 0.2v). In the periods between the pulses, verify operations are carried out. That is, the programming level of each cell of a group of cells being programmed in parallel is read between successive programming pulses to determine whether it is equal to or greater than a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) to stop the programming process for those cells. In some cases, the number of pulses will be limited (e.g. 20 pulses) and if a given memory cell is not completely programmed by the last pulse, then an error is assumed. In some implementations, memory cells are erased (in blocks or other units) prior to programming. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

FIG. 1 shows a program voltage signal Vpgm applied to the control gates (or, in some cases, steering gates) of flash memory cells. The program voltage signal Vpgm includes a series of pulses that increase in magnitude over time. At the start of the program pulses, the bit lines (e.g. connected to the drain) of all cells that are to be programmed are grounded, thereby, creating a voltage difference of Vpgm-0v from gate to channel. Once a cell reaches the targeted voltage (passing program verify), the respective bit line voltage is raised to Vdd so that the memory cell is in the program inhibit mode (e.g. program to that cell stops).

A multi-state flash memory cell is implemented by identifying multiple, distinct allowed threshold voltage ranges separated by forbidden voltage ranges. For example, FIG. 2 shows eight threshold ranges (0, 1, 2, 3, 4, 5, 6, 7), corresponding to three bits of data. Other memory cells can use more than eight threshold ranges or less than eight threshold ranges. Each distinct threshold voltage range corresponds to predetermined values for the set of data bits. In some implementations, these data values (e.g. logical states) are assigned to the threshold ranges using a gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

As described above, when programming flash memory cells, between the programming pulses the memory cells are verified to see if they reached the target threshold value. One means for verifying is to apply a pulse at the word line corresponding to the target threshold value and determine whether the memory cell turns on. If so, the memory cell has reached its target threshold voltage value. For arrays of flash memory cells, many cells are verified in parallel. For arrays of multi-state flash memory cells, the memory cells will perform a verification step of each state to determine which state the memory cell is within. For example, a multi-state memory cell capable of storing data in eight states may need to perform verify operations for seven compare points. FIG. 3 shows three programming pulses 10a, 10b and 10c (each of which are also depicted in FIG. 1). Between the programming pulses are seven verify pulses in order to perform seven verify operations. Based on the seven verify operations, the system can determine the state of the memory cells.

Performing seven verify operations after each programming pulses slows down the programming process. One means for reducing the time burden of verifying is to use a more efficient verify process. For example, in U.S. patent application Ser. No. 10/314,055, "Smart Verify for Multi-State Memories," filed Dec. 5, 2002, incorporated herein by reference in its entirety, a Smart Verify process is disclosed. In an exemplary embodiment of the write sequence for the multi-state memory during a program/verify sequence using the Smart Verify process, at the beginning of the process only the lowest state (e.g. state 1 of FIG. 2) of the multi-state range to which the selected memory cells are being programmed is checked during the verify phase. Once the first storage state (e.g. state 1 of FIG. 2) is reached by one or more of the memory cells, the next state (e.g. state 2 of FIG. 2) in the sequence of multi-states is added to the verify process. This next state can either be added immediately upon the fastest cells reaching this preceding state in the sequence or, since memories are generally designed to have several programming steps to move from state to state, after a delay of several cycles. The amount of delay can either be fixed or use a parameter based implementation, which allows the amount of delay to be set according to device characteristics. The adding of states to the set being checked in the verify phase continues as per above until the highest state has been added. Similarly, lower states can be removed from the verify set as all of the memory cells bound for these levels verify successfully to those target values and are locked out from further programming.

In addition to programming with reasonable speed, to achieve proper data storage for a multi-state cell, the multiple ranges of threshold voltage levels of the multi-state memory cell should be separated from each other by sufficient margin so that the level of the memory cell can be programmed and read in an unambiguous manner. Additionally, a tight threshold voltage distribution is recommended. To achieve a tight threshold voltage distribution, small program steps typically have been used, thereby, programming the threshold voltage of the cells more slowly. The tighter the desired threshold distribution, the smaller the steps and the slower the programming process.

One solution for achieving tight threshold distributions without unreasonably slowing down the programming process is to use a two phase programming process. The first phase, a coarse programming phase, includes attempts to raise the threshold voltage in a faster manner and paying relatively less attention to achieving a tight threshold distribution. The second phase, a fine programming phase, attempts to raise the threshold voltage in a slower manner in order to reach the target threshold voltage while also achieving a tighter threshold distribution. Example of coarse/fine programming methodologies can be found in the following patent documents that are incorporated herein by reference in their entirety: U.S. patent application Ser. No. 10/051,372, "Non-Volatile Semiconductor Memory Device Adapted to Store A Multi-Valued Data in a Single Memory Cell," filed Jan. 22, 2002; U.S. Pat. Nos. 6,301,161; 5,712,815; 5,220,531; and 5,761,222. When verifying a memory cell during programming, some prior solutions will first perform the verify process for the coarse mode and then subsequently perform the verify process for the fine mode. Such a verification process increases the time needed for verification. The coarse/fine programming methodology can be used in conjunction with the Smart Verify process described above.

As memory devices become smaller and more dense, the need for tighter threshold distributions and reasonable program times has increased. Although the coarse/fine programming methodology provides a solution to some existing issues, there is further need to improve the coarse/fine programming methodology to provide the desired tighter threshold distributions and reasonable program times.

SUMMARY OF THE INVENTION

The present invention, roughly described, pertains to technology for non-volatile memory. More specifically, the technology described herein can be used to provide an improved coarse/fine programming methodology.

One embodiment of the present invention includes an apparatus for programming non-volatile storage elements. The apparatus includes non-volatile storage elements in communication with a programming circuit and one or more verification selection circuits. The verification selection circuits cause a first subset of the non-volatile storage elements to be subjected to coarse verification concurrently while a second subset of non-volatile storage elements are subjected to fine verification.

Some embodiments of the present invention include a sense circuit in communication with a non-volatile storage element, a programming mode indication circuit providing output indicating whether the non-volatile storage element is in a coarse programming mode or a fine programming mode based on the sense circuit, and a first selection circuit in communication with the programming mode indication circuit. The first selection circuit applies a coarse verification signal to the non-volatile storage element if the non-volatile storage element is in a coarse programming mode and applies a fine verification signal to the non-volatile storage element if the non-volatile storage element is in a fine programming mode.

In one example of an implementation, the apparatus performs a method comprising the steps of determining whether the non-volatile storage element is in a coarse programming mode or a fine programming mode. Coarse verification is performed for the non-volatile storage element without performing fine verification on the non-volatile storage element if that non-volatile storage element is determined to be in the coarse programming mode. Fine verification is performed for that non-volatile storage element without performing coarse verification on the non-volatile storage element if that non-volatile storage element is determined to be in the fine programming mode.

Another embodiment in the present invention includes a non-volatile storage element having a gate and a set of control terminals. The apparatus also includes a switchable current sinking device in communication with at least one of the control terminals. The switchable current sinking device provides a coarse current sink to the control terminal if the non-volatile storage element is in a coarse programming mode and provides a fine current sink to the control terminal if the non-volatile storage element is in a fine programming mode. In some embodiments, a current sink is provided during the fine programming mode but not during the coarse programming mode.

Another embodiment of the present invention includes a sense circuit in communication with the non-volatile storage element, a programming mode indication circuit providing output indicating whether the non-volatile storage element is in a coarse programming mode or fine programming mode based on the sense circuit, and a switchable current sinking device in communication with the programming mode indication circuit and the non-volatile storage element. The switchable current sinking device provides a coarse current sink to the non-volatile storage element if the non-volatile storage element is in the coarse programming mode and provides a fine current sink to the non-volatile storage element if the non-volatile storage element is in fine programming mode. In one embodiment, an apparatus will apply a common programming signal to a gate for a non-volatile storage element, sink a first current from the non-volatile storage element during coarse programming, determine that a threshold voltage of the non-volatile storage element has reached a first verify level and switch the sinking to seek a second current in response to determining if the threshold voltage of the non-volatile storage element has reached the first verify level.

Another embodiment of the present invention includes a sense circuit in communication with a non-volatile storage element, a programming mode indication circuit providing an output indicating whether the non-volatile storage element is in a coarse programming mode or a fine programming mode based on the sense circuit, and a switchable charge packet metering circuit in communication with the programming mode indication circuit and the non-volatile storage element. The switchable charge packet metering circuit provides a metered charge to the non-volatile storage element in response to the programming mode indication circuit indicating that the non-volatile storage element is in the fine programming mode.

Yet another embodiment of the present invention includes a set of non-volatile storage elements and an individually switchable charge packet metering system in communication with the non-volatile storage elements. The individually switchable charge packet metering system is individually switched to provide a particular metered charge to program non-volatile storage elements in a fine programming mode without providing that particular metered charge to program non-volatile storage elements in a coarse programming mode. One embodiment includes performing a coarse programming process on the non-volatile storage elements, determining that the non-volatile storage elements should switch to a fine programming process, and performing the fine programming process in response. One implementation of the fine programming process includes the pre-charging of a control line for a non-volatile storage element and discharging that control line via the non-volatile storage element in order to program that non-volatile storage element.

These and other objects and advantages of the present invention will appear more clearly from the following description in which the preferred embodiment of the invention has been set forth in conjunction with the drawings.

BRIEF DESCRIPTION OF THE DRAWINGS

FIG. 8 is a table providing example voltages for one way to operate the memory cells.

DETAILED DESCRIPTION

I. Memory System

Figure 4:
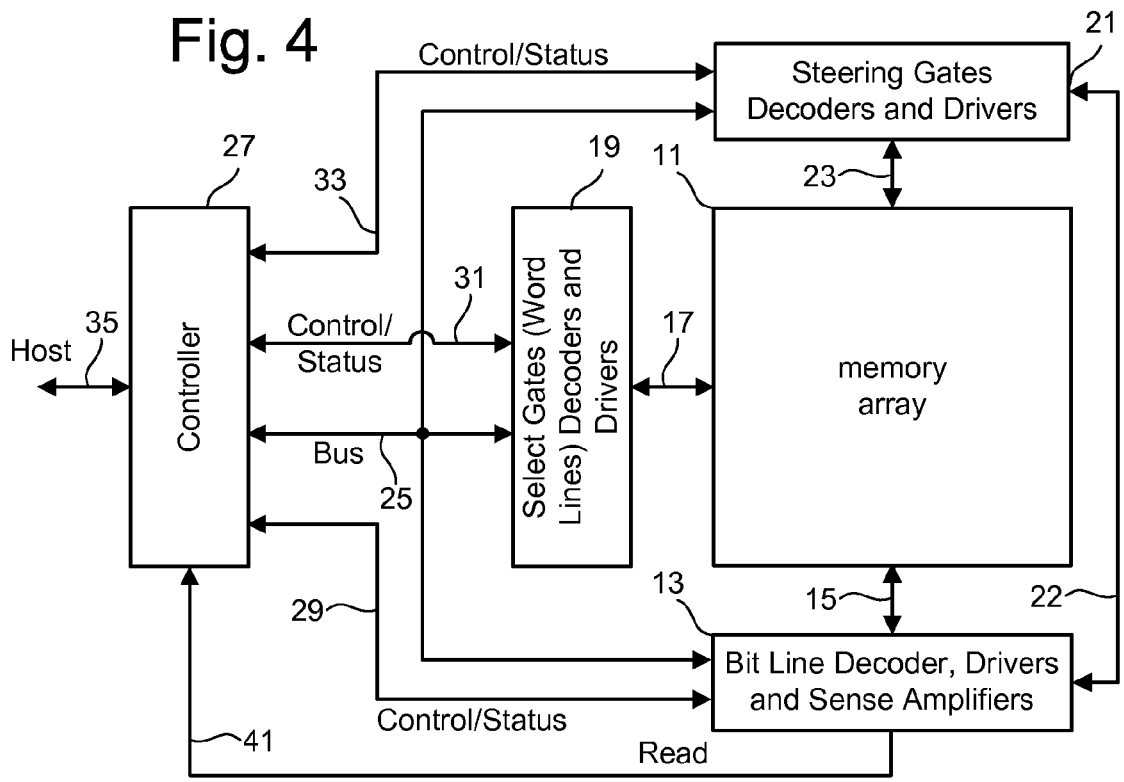
FIG. 4 is a block diagram of one embodiment of a flash memory system that can implement the present invention.

An example memory system incorporating the various aspects of the present invention is generally illustrated in the block diagram of FIG. 4. Architectures other than that of FIG. 4 can also be used with the present invention. A large number of individually addressable memory cells 11 are arranged in an array of rows and columns. Bit lines, which extend along columns of array 11, are electrically connected with bit line decoder, driver and sense amplifiers circuit 13 through lines 15. Word lines, which extend along rows of array 11, are electrically connected through lines 17 to word line decoders and drivers circuit 19. Steering gates, which extend along columns of memory cells in array 11, are electrically connected to steering gate decoders and drivers circuit 21 through lines 23. Each of the circuits 13, 19 and 21 receives addresses from controller 27 via bus 25. The decoder and driving circuits 13, 19 and 21 are also connected to controller 27 over respective control and status signal lines 29, 31, and 33. Voltages applied to the steering gates and bit lines are coordinated through bus 22 that interconnects the controller and driver circuits 13 and 21. In some embodiments, controller 27 includes a state machine to coordinate performance of the functions described herein. In other embodiments, the state machine operates separately from the controller.

Controller 27 is connectable through lines 35 to a host device (not shown). The host may be a personal computer, notebook computer, handheld device, digital camera, audio player, cellular telephone or various other devices. The memory system of FIG. 4 can be implemented in a card according to one of several existing physical and electrical standards, such as one from the PCMCIA, the Compact-Flash™ Association, the MMC™ Association, Smart Media, Secure Digital™, Memory Stick, and others. When in a card format, the lines 35 terminate in a connector on the card which interfaces with a complementary connector of the host device. Alternatively, the memory system of FIG. 4 can be embedded in the host device. In yet another alternative, controller 27 can be embedded in the host device while the other components of the memory system are on a removable card. In other embodiments, the memory system can be in packaging other than a card. For example, the memory system can be in one or more integrated circuits, one or more circuit boards or other packages.

Decoder and driver circuits 13, 19 and 21 generate appropriate voltages in their respective lines of array 11, as addressed over the bus 25, according to control signals in respective control and status lines 29, 31 and 33 to execute programming, reading and erasing functions. Status signals, including voltage levels and other array parameters, are provided by array 11 to controller 27 over the same control and status lines 29, 31 and 33. A plurality of sense amplifiers within the circuit 13 receive current or voltage levels that are indicative of the states of addressed memory cells within array 11. The sense amplifiers provide controller 27 with information about the states of the memory cells over lines 41 during a read operation. A large number of sense amplifiers are usually used in order to be able to read the states of a large number of memory cells in parallel.

II. Memory Cell

Figure 5:
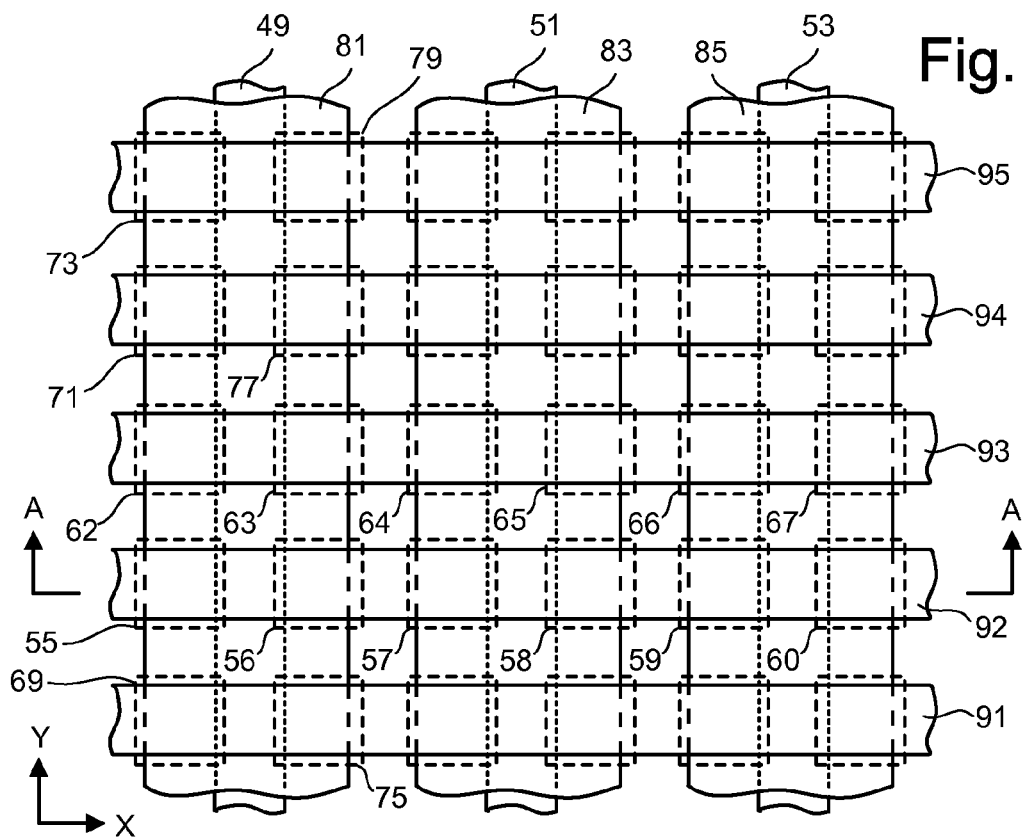
FIG. 5 is a plan view of one embodiment of a portion of the memory cell array of the system of FIG. 4.
Figure 6:
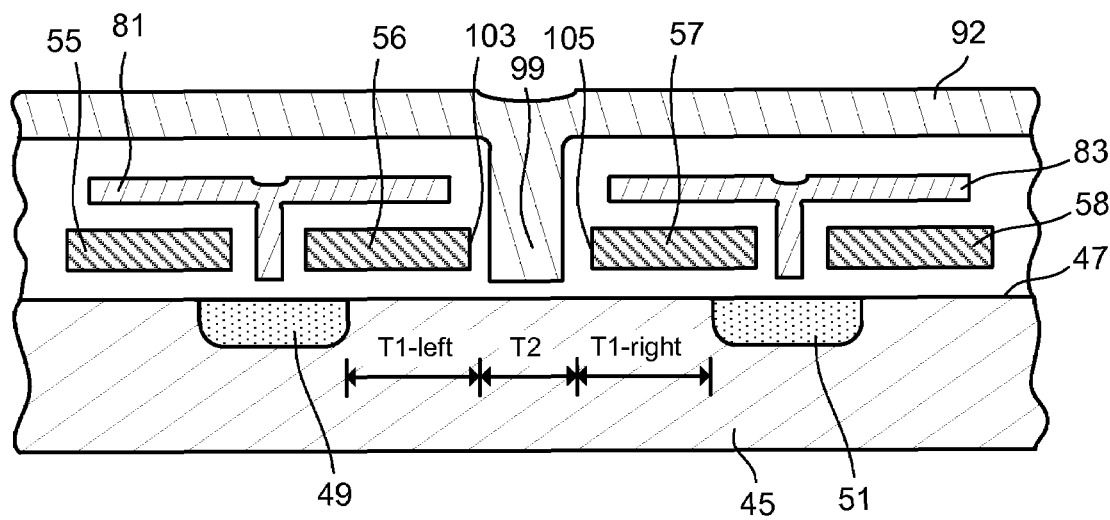
FIG. 6 is a partial cross-sectional view of the memory cell array of FIG. 5 taken at section A-A.

FIG. 5 is a plan view of a first embodiment of a portion of memory array 11. FIG. 6 is a partial cross-sectional view of the memory array taken at Section A-A. The substrate and conductive elements are illustrated with little detail of dielectric layers that exist therebetween in order to simplify the figures. However, it will be understood that appropriate oxide layers are to be included between the conductive layers themselves, and the conductive layers and the substrate.

A silicon substrate 45 includes a planar top surface 47. Elongated diffusions 49, 51 and 53 are formed into the substrate 45 through the surface 47 by an initial ion implantation and subsequent diffusion. Elongated diffusions 49, 51 and 53 serve as sources and drains of the memory cells. In order to provide a convention for this description, the diffusions are shown to be spaced apart in a first "x" direction, with lengths extending in a second "y" direction. These "x" and "y" directions are essentially orthogonal with each other. A number of floating gates are included across the substrate surface 47, with suitable gate dielectric therebetween, in an array of rows and columns. One row of floating gates 55, 56, 57, 58, 59, 60 is adjacent to and parallel with another row of floating gates 62, 63, 64, 65, 66, 67. A column of floating gates 69, 55, 62, 71 and 73 is adjacent to and parallel with a column of floating gates 75, 56, 63, 77 and 79. The floating gates are formed from a first layer of conductively doped polycrystalline silicon ("polysilicon") that is deposited over the surface and then separated by etching using one or more masking steps into the individual floating gates.

Bit line decoder and driver circuit 13 (See FIG. 4) is connected through lines 15 with all of the bit line source/drain diffusions of the array, including the diffusions 49, 51 and 53 of FIG. 5. The sources and drains of columns of individual memory cells are connected to proper operating voltages for either reading or programming in response to addresses supplied over bus 25 and control signals over the lines 29.

The structure of FIGS. 5 and 6 uses one steering gate for every two columns of floating gates. Steering gates 81, 83 and 85 are elongated in the "y" direction and have a width in the "x" direction that extends across two adjacent columns of floating gates and a source/drain diffusion that is positioned in between them. The space between any two of the steering gates is at least as great as the space in the "x" direction between adjacent columns of floating gates that are overlaid by the two steering gates, in order to allow a gate to be later formed at the substrate in this space. The steering gates are formed by etching a second layer of conductively doped polysilicon that is deposited over the entire surface over the first polysilicon layer and an appropriate inter-polysilicon layer dielectric. Steering gate decoder and driver circuit 21 (see FIG. 4) connects though lines 23 to all the steering gates and is able to individually control their voltages in response to addresses provided on the bus 25, control signals on the lines 33, and data from drivers and sense amplifiers 13.

Word lines 91, 92, 93, 94 and 95 are elongated in the "x" direction and extend over the steering gates with spaces between them in the "y"-direction that places each word line in alignment with a row of floating gates. The word lines are formed by etching a third layer of conductively doped polysilicon that is deposited over the entire surface on top of a dielectric that is first formed over the second polysilicon layer and regions exposed between the steering gates. The word lines allow selection of all the memory cells in its row for reading or writing. Select gate decoder and driver circuit 19 (see FIG. 4) is connected with each word line in order to individually select one row of the memory array. Individual cells within a selected row are then enabled for reading or writing by the bit line and steering gate decoder and driver circuits 13 and 21 (see FIG. 4).

Although the gates in the foregoing structure are preferably made of doped polysilicon material, other suitable electrically conductive materials may be used in place of one or more of the three polysilicon layers described. The third layer, for example, from which the word lines and select gates are formed, may be a polycide material, which is polysilicon with a conductive refractory metal silicide on its top, such as tungsten, in order to increase its conductivity. Polycides are generally not used in place of either the first or second polysilicon layers because the quality of inter-polycrystalline-silicon oxides formed from a polycide is usually not satisfactory.

Not shown in FIGS. 5 and 6 are the metal conductor layers. Since the diffusions and polysilicon elements usually have a conductivity that is significantly less than that of metal, metal conductors are included in separate layers with connections made to respective metal lines through any intermediate layers at periodical intervals along the lengths of the polysilicon elements and diffusions. Since all of the diffusions and polysilicon elements of the embodiment of FIGS. 5-6 need to be separately driven, there is typically a one-to-one correspondence between the number of these metal lines and the number of diffusions and polysilicon elements.

Figure 7:
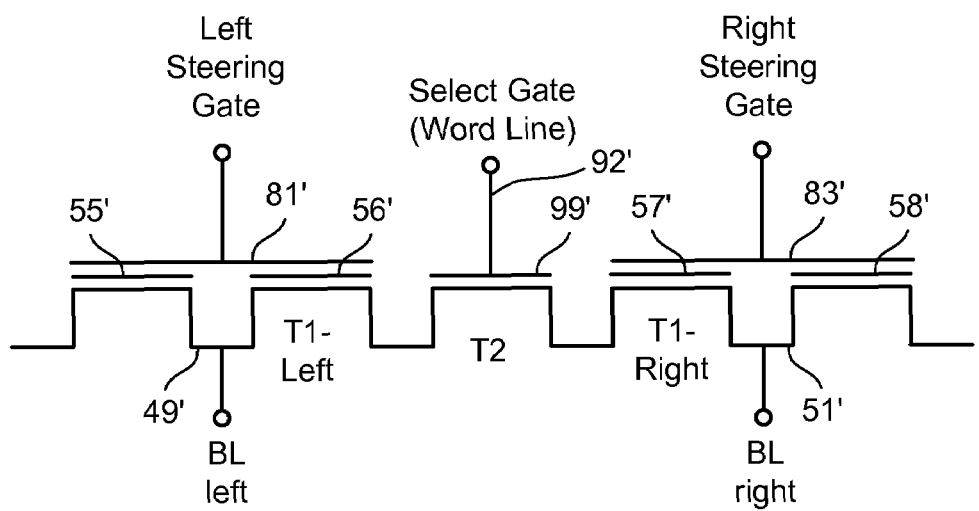
FIG. 7 is an electrical equivalent circuit to the structure of FIG. 3.

FIG. 7 depicts an electrically equivalent circuit to the structure of FIG. 6, where equivalent elements are identified by the same reference numbers as in FIGS. 5 and 6, but with a prime (') added. The illustrated structure shares the source and drain diffusions with a neighboring structure. Conduction through the channel in the substrate between the adjacent diffusions 49 and 51 is controlled by different gate elements in three different regions. A first region to the left (T1-left) has the floating gate 56 immediately above it and the steering gate 81 capacitively coupled with it. A second region to the right (T1-right) is controlled in a similar manner by the floating gate 57 and the steering gate 83. A third region T2, between T1-left and T1-right, is controlled by select gate 99 that is part of word line 92.

The level of conduction of electrons through the channel between diffusions 49 and 51 is thus affected by the electric fields imparted by these different gate elements to their respective channel regions through the voltages placed on the gates. The voltage on a floating gate is dependent upon the level of net electrical charge it carries plus all displacement charge that is capacitively coupled from other gates and nodes. The level of conduction that is permitted through the channel portion under a floating gate is controlled by the voltage on that floating gate. The voltage on select gate 99 simply turns the channel off and to a targeted conduction level in order to select individual cells for connection with their source/drain regions. In one embodiment, an individual memory cell can be considered as a series connection of three transistors, one for each of the three different regions (T1-left, T2, T1-Right) of the channel. In other embodiments, each floating gate can be considered a memory cell.

One of the two floating gates of a single memory cell is selected for programming or reading by placing a voltage on the steering gate above the other (non-selected) floating gate of the cell that is sufficient to cause the channel region under the other floating gate to become adequately conductive no matter what charge (which is related to its state) is carried by that other floating gate. When that cell's select transistor is turned on by a sufficient voltage applied to its word line, it is only the selected floating gate that responds to reading or programming operations directed to the cell. During a reading of the state of the one floating gate, current through the cell between its source and drain is then dependent upon the charge carried by the selected floating gate without regard to the charge on the other floating gate. Although the voltage placed on the steering gate over the non-selected floating gate to render the channel portion under the non-selected floating gate conductive is also coupled to an adjacent floating gate of an adjacent cell through the same steering gate, impact on the adjacent cell is avoided by placing proper voltage conditions on the other elements of the adjacent cell.

The floating gates of the embodiment of FIGS. 5-7 are preferably programmed by placing voltages on its bit lines (source and drain diffusions) and its two steering gates that cause electrons to obtain enough energy in the substrate channel region to be injected across the gate dielectric into the selected floating gate. A preferred technique for this is "source side injection," described in the U.S. Pat. Nos. 5,313,421 and 5,712,180, both of which are incorporated herein by reference in their entirety.

In order to erase the memory cells of the embodiment of FIGS. 5-7, they may be designed and operated so that electrons are removed from the selected floating gates to either the channel or the select gate of the word line. If erased to the select gate, the dielectric between floating gate edge 103 and select gate 99 is preferably a thin layer of oxide that has been grown on the floating gate edge and through which electrons tunnel when appropriate voltages are placed on the various elements of the cell. The same is provided between floating gate edge 105 and select gate 99. When designed to be erased to select gate 99, care is taken to make sure that a resulting voltage gradient across the gate dielectric between the select gate and substrate surface 47 remains sufficiently below a breakdown level of that dielectric. This is a concern because the word line is typically raised to a level in excess of 10 volts and sometimes to 20 volts or more during erase, while other voltages applied to the cell are usually 5 volts or less. The voltage gradient across the select gate dielectric can be reduced by making it thicker or the select gate dielectric can be selected to have a dielectric constant that is higher than normally used. The later can adversely affect operation of the select transistor.

If the cells are to be erased to the channel, the embodiment of FIGS. 5-7 is modified somewhat. First, the dielectric between select gate 99 and the adjacent floating gate edges 103 and 105 is made to be thicker to prevent erasing of the floating gates to the select gate. Second, the thickness of the gate dielectric between an underside of the floating gates and the substrate surface 47 is made thinner, such as about 100 Angstroms, to facilitate electrons tunneling through it. Third, the cells to be simultaneously erased as a block are grouped together along columns or within blocks. In one embodiment, a block is isolated on the substrate from other blocks. This is typically done by a triple well process, where an n-well is formed in a p-substrate, and a p-well carrying the block of cells is positioned within the n-well that isolates the block from others. An appropriate erase voltage is then applied to the p-wells of the blocks to be erased, while other blocks are not affected.

More details about the structures of FIGS. 4-7 can be found in U.S. Pat. No. 6,151,248, which is incorporated herein by reference in its entirety.

The memory structure of FIGS. 4-7 is one example of a suitable memory cell. Other structures can also be used to implement the present invention. For example, one embodiment can use a multi-layer dielectric that includes a charge storing dielectric. Other embodiments of the present invention can use NAND type flash memory cells or NOR type flash memory cells. Relevant examples of NAND type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528 and U.S. patent application. Ser. No. 09/893,277 (Publication No. US2003/0002348). The following patents describe NOR type flash memories and are incorporated herein by reference in their entirety: U.S. Pat. Nos. 5,095,344; 5,172,338; 5,890,192 and 6,151,248. Other types of flash memory cells and other types of non-volatile storage elements can also be used.

III. Memory Array Operation

Example operating voltages to program, read and erase the memory cells of array 11 are provided in the table of FIG. 8. Line (2) pertains to the operation of the type of cells that are erased to the select gates (word lines), while line (8) shows a modification for operating the type of cells that are erased to the substrate. In these examples, the substrate portion in which the cells are formed contains p-type doping and the bit line diffusions are of n-type. The substrate is held at ground potential throughout these operations.

In line (1) of the FIG. 8 table, the voltage conditions are given for a row that is not selected. The word line of an unselected row is placed at ground potential by driver circuit 19 (FIG. 4). The "X" in the columns for the bit lines (diffusions) and steering gates of cells along an unselected row indicates that the voltages on those elements do not matter—a "don't care" situation. Since there are no negative voltages generated by any of the circuits 13, 19 and 21 for elements of the array, in this example, a zero voltage on the select gates of a row assures that none of the cells along that row are enabled. No current can flow through their channels. Programming or reading of other cells in the same columns of a different row can take place without affecting the row having a zero voltage on its word line.

The second line (2) of the table provides an example set of voltages for erasing the type of cells designed to be erased to the word line's select gate. A high erase voltage $V_E$ in a range of 10-25 volts (e.g. 20 volts) is applied by driver circuits 19 to all the word lines whose floating gates are to be erased. This is usually at least one defined block of cells including all cells in a large number of contiguous rows. However, in applications where it is preferred, fewer or more cells may be simultaneously erased. The erase block can, alternatively, even be limited to a single row of cells. The steering gates of the cells along the one or more selected rows are set to a low voltage by the driving circuit 21 (e.g., zero volts) in order to maintain, by the high degree of capacitive coupling between the steering and floating gates, the voltage of the floating gates at a low level. The resulting potential difference between the floating gates and their respective select gates (word lines) causes electron tunneling through the intermediate dielectric. More information about erasing is found in U.S. Pat. No. 5,270,979, incorporated herein by reference.

Lines (3) and (4) in the table of FIG. 5 provide example voltages for reading the state of the two floating gates of a memory cell: line (3) for the left floating gate and line (4) for the right floating gate. In each case, the cell is enabled by the select gate being raised to a voltage $V_{SR}$ sufficient to turn on the cell's select transistor to enable current to flow through the channel. This voltage is typically one volt higher than the threshold of the select transistor.

When reading the voltage state of one floating gate, the steering gate over the floating gate being read has a voltage $V_M$ applied to it and the steering gate over the other floating gate is raised to $V_{BR}$, as shown in lines (3) and (4) of the table of FIG. 8. The voltage $V_{BR}$ is made to be high enough (e.g., 8 volts) to render the cell's channel portion under the non-selected floating gate sufficiently conductive, no matter what the programmed state of the non-selected floating gate. To read the state of the selected floating gate, the voltage $V_M$ is stepped through multiple voltages (described below) during the reading step, and its value when the cell current passes through a defined threshold is detected by the sense amplifiers within circuit 13.

Example voltages for programming one floating gate of a dual floating gate cell are given in lines (5) and (6) of the table of FIG. 8. In order to select the cell for operation, the select gate is raised sufficiently to turn on the cell's select transistor. The voltage $V_{SP}$ may be different from the voltage $V_{SR}$ used during reading in order to optimize the source side injection programming speed. An example is $V_{SP}$ =2.2 volts when the threshold of the select transistor is one volt. The bit line diffusion on the same side of the cell as the floating gate selected to be programmed is raised to a maximum bit line voltage (e.g., 5 volts) during the programming operation. This voltage is made high enough to enable a sufficient field to be built up across the gap between the floating and select gate channels to obtain source side hot electron programming. The bit line diffusion on the same side of the cell as the non-selected floating gate is biased at or near zero volts during programming.

The steering gate over the non-selected floating gate is raised to a voltage $V_{BP}$ that is sufficient to render the channel region under the non-selected floating gate sufficiently conductive (e.g. $V_{BP}$=8 volts) in order to pose no interference to programming of the target floating gate, regardless of what floating gate voltage exists on the non-selected floating gate, within a programming window range of floating gate voltages. A voltage $V_P$ is applied to the steering gate over the selected floating gate with a level that drives the selected floating gate to a voltage that assists in creating the desired field conditions in the channel below it for hot electron programming. For example, the voltage $V_P$ can be within the range of 5-12 volts. This voltage may vary during the programming operation. Typically, the appropriate set of programming voltages is first applied to an erased cell, followed by the appropriate set of reading voltages, and, if the reading step does not indicate that the selected floating gate has been programmed to the desired voltage state, which may be the programming state for binary storage or one of the variable storage states for multi-level storage, programming voltages are again applied which may in part be different from the earlier set.

Line (7) of the table of FIG. 8 shows voltages that are applied to those cells within a row selected for programming that are themselves not to be programmed. For example, the number of cells programmed at the same time within one row of a segmented portion of an array are spaced alternately along the row with other cells in between them that are not being programmed. It is these other cells not being programmed that receive the voltages of line (7) of the table of FIG. 8. The opposing bit line diffusions are maintained at the same voltage in order to prevent any current from flowing in the channel (e.g., both at zero or both at 5 volts). As with the notation used in line (1), the "x" indicates that the voltages on the steering gates of these cells are a don't care.

In the case of memory arrays designed to be erased to the substrate, erase voltage conditions of line (8) are applied instead of those of line (2). Both the p-well containing a block of cells to be erased and its surrounding n-well are raised to the erase voltage $V_E$, within an example range of 10-25 volts (e.g. 20 volts preferred). During reading and programming such cells, their wells are held at ground potential. A positive voltage $V_{SE}$ is preferably applied to the select gates during erase in order to reduce the voltage applied across the select gate dielectric, since an excessive voltage differential between the substrate and select gate can damage the dielectric material or cause it to be made thicker than otherwise desirable for operation of the cells. Since such a voltage is partially coupled from the select gates to the adjoining floating gates sought to be erased, it cannot be too high or else the voltage differential between the floating gates and the substrate channel, which is made high to effect the erase, is reduced too far. An example range of $V_{SE}$ is 3-12 volts, depending upon the level of $V_E$. $V_{SE}$=10 volts is preferred when $V_E$=20 volts.

The values provided in FIG. 8 are one set of examples. Those skilled in the art will be able to use other suitable values and methodologies for operating the memory system.

IV. Coarse/Fine Programming

Figure 9A:
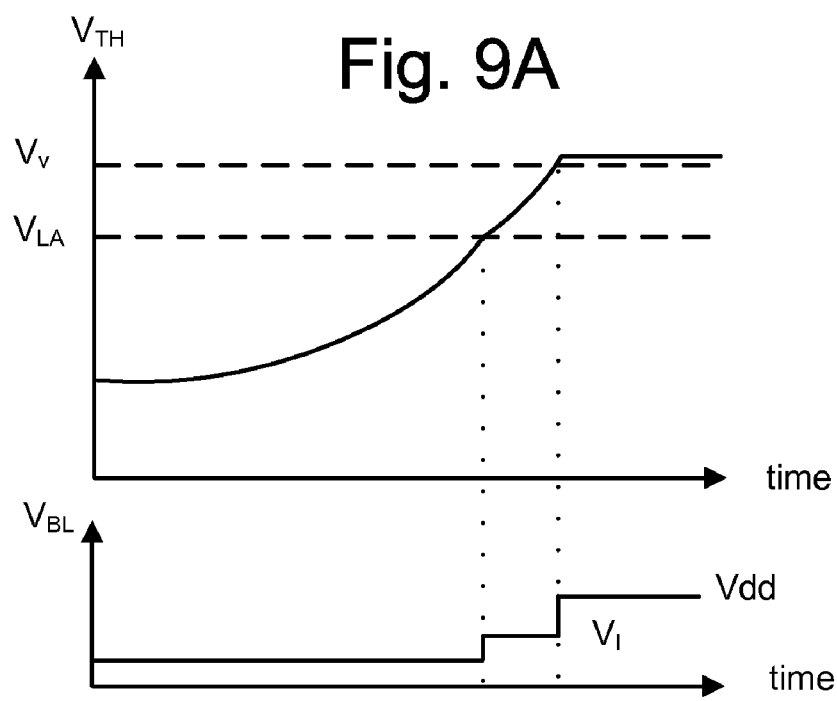
FIG. 9A includes graphs of threshold voltage and bit line voltage versus time for coarse/fine programming.

FIG. 9A provides graphs of threshold voltage ($V_{TH}$) versus time and bit line voltage ($V_{BL}$) versus time to indicate how one example of a coarse/fine programming process is performed. Various alternatives and embodiments of the coarse/fine programming methodology can also be used. The method depicted in FIG. 9A starts with the programming-process performing the coarse phase of the programming process. When the threshold voltage of the memory cell reaches voltage of $V_{L4}$, then the memory cell enters a fine programming phase by raising the bit line voltage of the cell to a value of $V_I$ in order to slow down the programming. During the fine programming phrase, programming is slowed, as compared to the coarse programming phase. Therefore, the change in threshold voltage per program step is likely to be smaller during the fine programming phase. The memory cell will remain in the fine programming phase until the threshold voltage of the memory cell has reached the target threshold voltage level of $V_V$. When the threshold voltage of the memory cell reaches $V_V$, the memory cell's bit line voltage is raised to Vdd to inhibit further programming of that cell. In one embodiment, $V_{LA}$ is one $V_{pgm}$ step size below $V_V$. In other embodiments, the difference between $V_{LA}$ and $V_V$ is greater.

Figure 9B:
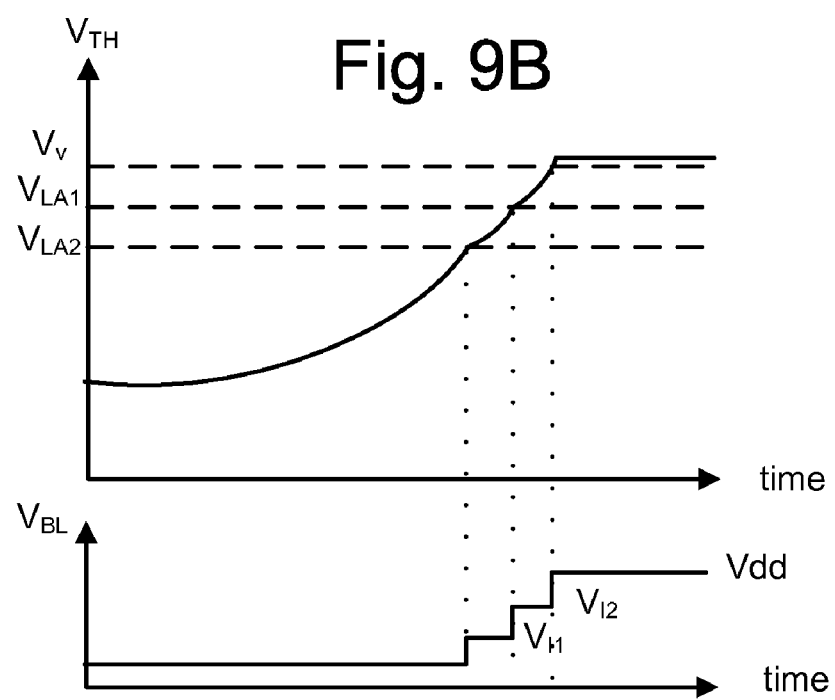
FIG. 9B includes alternative graphs of threshold voltage and bit line voltage versus time for coarse/fine programming.

The process depicted by FIG. 9A assumes one coarse programming mode and one fine mode. In other embodiments, multiple coarse modes and/or multiple fine modes can be used. For example, FIG. 9B shows three modes. In other embodiments more than three modes can be used. The embodiment to FIG. 9B shows a first mode (the most coarse mode) which is performed until the threshold voltage of the memory cell reaches $V_{LA2}$. At that point the memory cell transitions to the intermediate programming mode (finer than the most coarse mode and coarser than the most fine mode), at which point the bit line is raised to the $V_{i1}$. The memory cell will remain in intermediate mode until the threshold voltage of the memory cell reaches $V_{LA1}$, at which time the memory cell will enter the finest program mode and the bit line will be raised to $V_{i2}$. The memory cell will remain in the finest program mode until the threshold voltage of the memory cell reaches $V_V$. When the memory cell threshold voltage reaches $V_V$, the bit line will be raised to Vdd in order to inhibit further programming of that memory cell. In other embodiments, as discussed above, more than three modes can be used (e.g. 4 modes, 5 modes, etc.).

Figure 10:
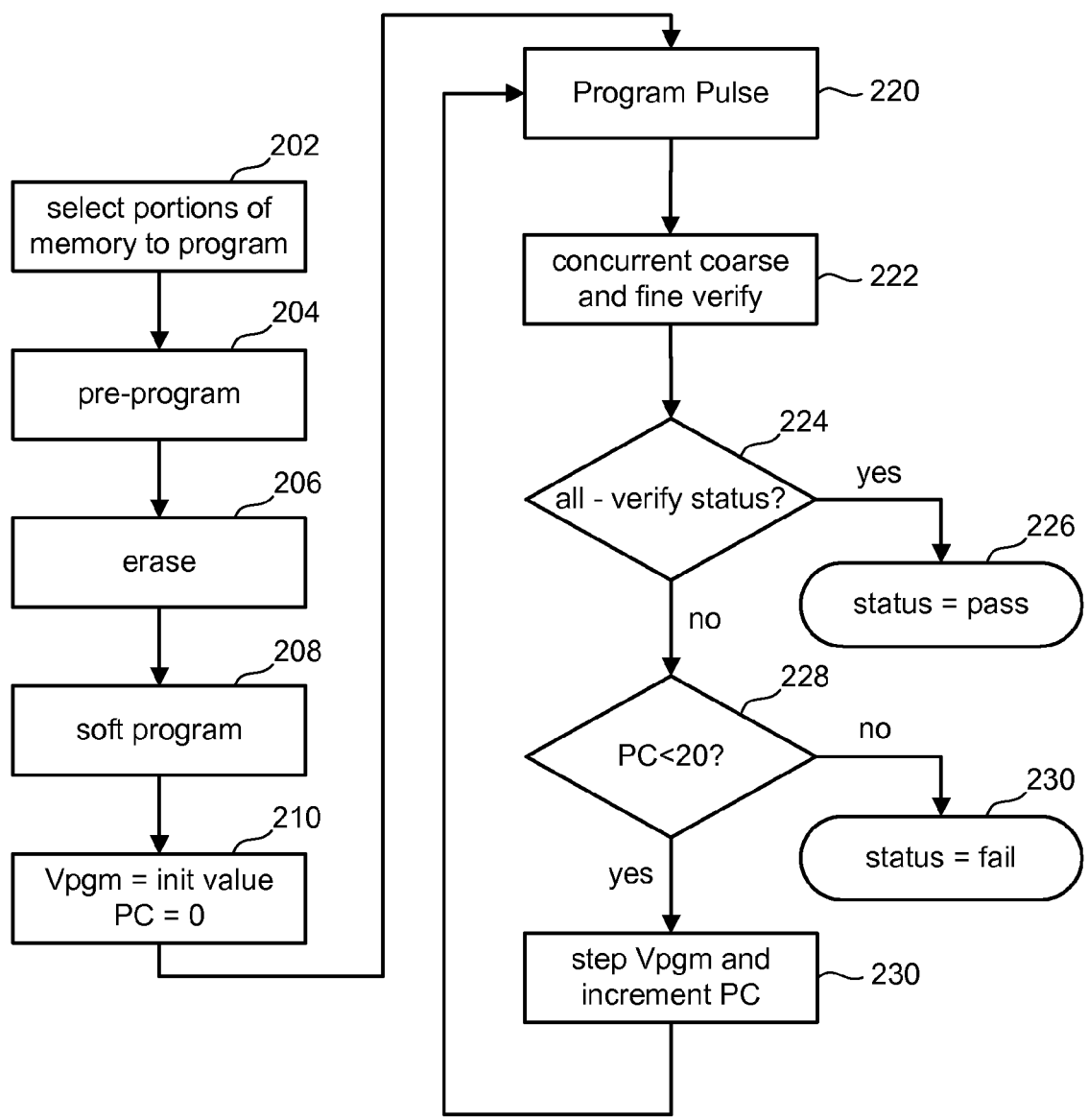
FIG. 10 is a flow chart describing one embodiment of a process for programming non-volatile memory.

FIG. 10 is a flow chart describing one embodiment of the coarse/fine programming process. In step 202, the portion of the memory to be programmed is selected. In one implementation, this can be one or more write units appropriate to the memory structure. One example of a write unit is referred to as a page. In other embodiments, other units and/or structures can also be used. In step 204, a pre-programming process is sometimes used wherein the addressed memory cells are given non-data dependent programming to level out storage element wear and provide a more uniform starting point for the subsequent erase. In step 206, an erased process is performed, as appropriate for the type of storage element being used. One example of a suitable smart erase process is described in U.S. Pat. No. 5,095,344, incorporated herein by reference in its entirety. Step 208 includes a soft programming process designed to put the threshold voltages of erased memory cells into a more uniform starting range for the actual write phase. In one embodiment, if any of the memory cells fail to verify during erase (or during soft programming), they can be mapped out of the logical address space. At this point the memory is ready for the data conditional programming phase.

Figure 1:
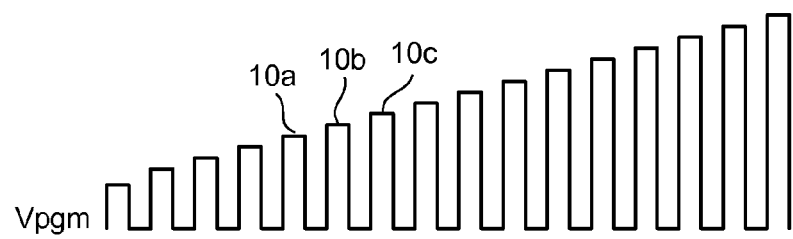
FIG. 1 depicts an example of a program voltage used to program non-volatile memory cells.
Figure 3:
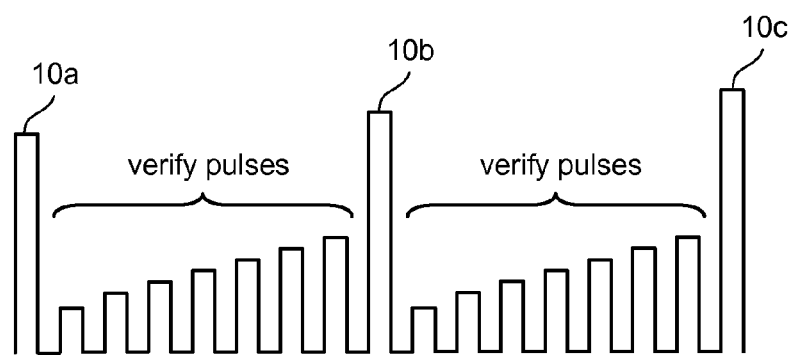
FIG. 3 depicts an example of program voltage pulses used to program flash memory cells and verification pulses between the program pulses.

In step 210, the program voltage (Vpgm) is set to an initial value. For example, in some embodiments, the staircase wave form of FIG. 1 is used and step 210 includes setting the initial pulse. Also, in step 210, a program counter (PC) is initialized to zero. In step 220, a program pulse is applied. For example, one iteration of step 220 could include applying program pulse 10A of FIG. 3. In step 222, a concurrent course and fine verification process is performed. One or more memory cells are verified for coarse programming in a manner that overlaps in time with one or more memory cells being verified for fine programming. For example in regard to binary memory cells (e.g., two states), while some memory cells are being verified for coarse programming, other memory cells are being verified for fine programming. With regard to multi-state memory cells, while some memory cells are being verified for coarse programming for a particular state, other memory cells are being verified for fine programming for the same particular state. In other embodiments regarding multi-state memory cells, different memory cells can be concurrently programmed/verified for different states where some memory cells are being verified for coarse programming while other memory cells are being verified for fine programming. More details of step 222 are described below.

In step 224, it is determined whether all of the memory cells have verified that their threshold voltages are at the final target voltage for that memory cell. If so, the programming process is completed successfully (status=pass) in step 226. If all of the memory cells are not all verified, then it is determined whether the program counter (PC) is less than 20. If the program counter (PC) is not less than 20 (step 228), then the program process has failed (step 230). If the program counter (PC) is less than 20, then the program counter (PC) is incremented by 1 and the program voltage is stepped up to the next pulse in step 230. Subsequent to step 230, the process loops back to step 220 and the next program pulse is applied to the memory cells.

V. Verification

Figure 11:
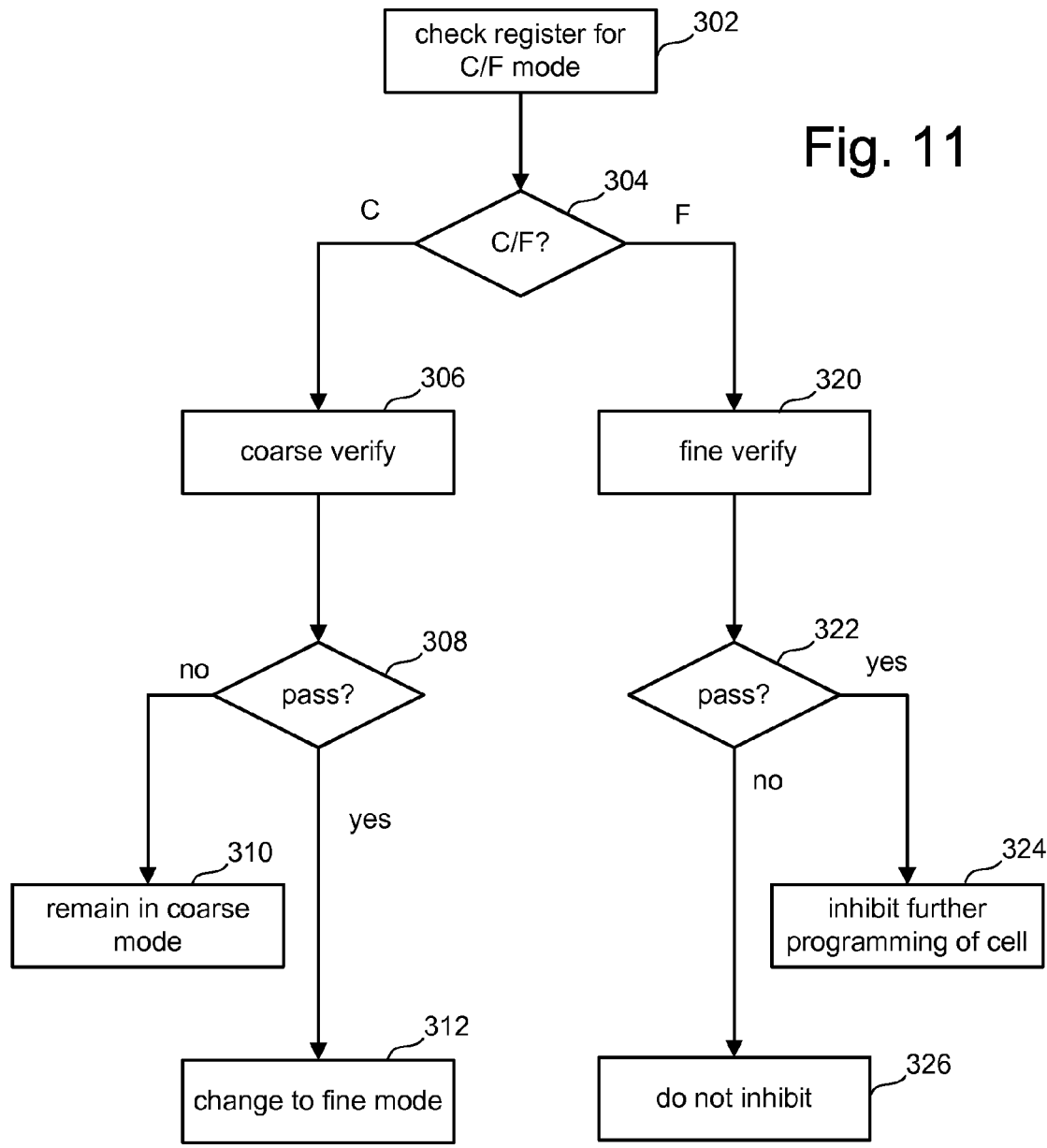
FIG. 11 is a flow chart describing one embodiment of a process for performing coarse/fine verification.

FIG. 11 provides a flow chart describing one embodiment of a process of performing coarse verification concurrently with fine verification (see step 222 of FIG. 10). In step 302 of FIG. 11, the system will check a register (or other storage device) to determine whether the particular flash memory cell is in the coarse programming mode or the fine programming mode. If the memory cell is in the coarse phase (step 304), then a coarse verification is performed in step 306. For example, looking at FIG. 9A, the memory cell could have its threshold voltage compared to voltage $V_{LA}$. If the threshold voltage of the memory cell is above $V_{LA}$ (step 308), then the memory cell has passed the coarse verification test. If the threshold voltage of the memory cell is less $V_{LA}$, then the memory cell has not passed the verification test. If the memory cell has not passed the coarse verification test, then the memory cell remains in the coarse programming mode (step 310). If the memory cell passes the coarse verification test, the memory cell will change programming modes to the fine programming mode (step 312).

If, in step 304, it is determined that the memory cell was in the fine programming mode, then a fine verification process will be performed in step 320. For example, looking at FIG. 9A, the threshold voltage of the memory cell can be compared to the final target threshold voltage $V_V$. If the memory cell's threshold voltage is greater than the target voltage $V_V$ (step 322), then the fine verification test has passed and the memory cell will be inhibited from programming in step 324. One embodiment for inhibiting a memory cell from further programming is to raise the bit line to Vdd. Other means for locking out a memory cell can also be used. If, in step 322, it is determined that the verification test did not pass (e.g. because the threshold voltage of the memory cell is less than target voltage $V_V$), then the memory cell will not be inhibited from further programming (step 326).

Figure 2:
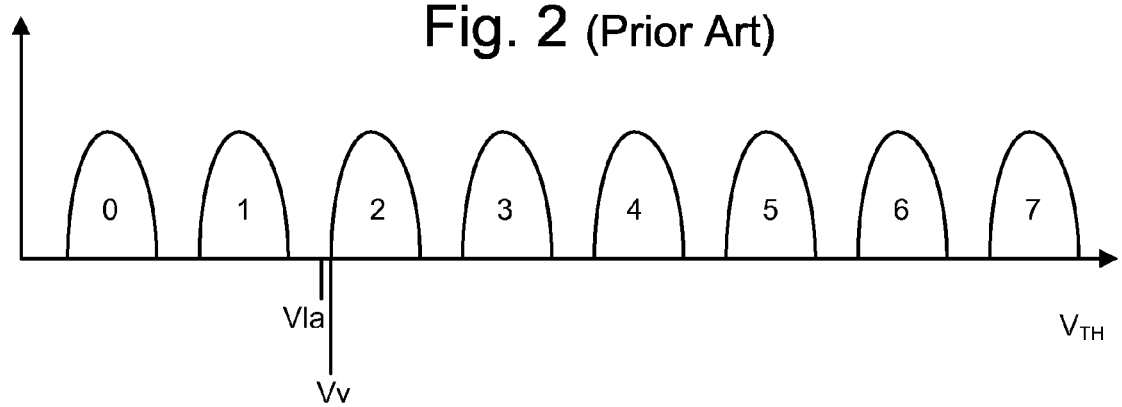
FIG. 2 depicts an example of a state space for a non-volatile memory device.

The process in FIG. 11 is performed on an individual cell. In many embodiments, multiple cells will be programmed concurrently. Thus, the process of FIG. 11 will be performed on multiple cells concurrently. During such programming, some of the cells will be in the coarse programming process while other cells are in the fine programming process. Thus, some of the cells will perform coarse verification step 306 while other cells will perform fine verification step 320. For example, a set of cells being programmed to State 2 (see FIG. 2) may have some cells programming faster than other cells. The faster programming cells may enter the fine phase sooner. Those cells in the fine phase will have their threshold voltage compared to verified point $V_V$ of state 2 while the memory cells in the coarse phase may have their threshold voltage compared to $V_{LA}$ of state 2. The process of FIG. 11 provides efficiency because at each verification step any given cell will only have a coarse verification performed or a fine verification performed, but not both. On the other hand, prior systems would do both coarse and fine verification sequentially. With one embodiment of the present invention, if the memory cell is a multi-state cell and has to test for verification for multiple states, then there will be coarse verifications for the multiple states or there will be fine verification for the multiple states. However, there will not be both coarse and fine verifications for the multiple states for a particular memory cell. For example, looking back at FIG. 3, seven verification pulses are depicted. In an eight-state memory cell, the seven verification pulses will be used for a coarse verification process or the seven verification pulses will be used for the fine verification process. In some prior art devices, if there were eight states, they would need fourteen verification pulses, seven pulses for the coarse phase and seven pulses for the fine phase. Thus, the process in FIG. 11 can reduce the number of verification pulses needed.

Figure 12:
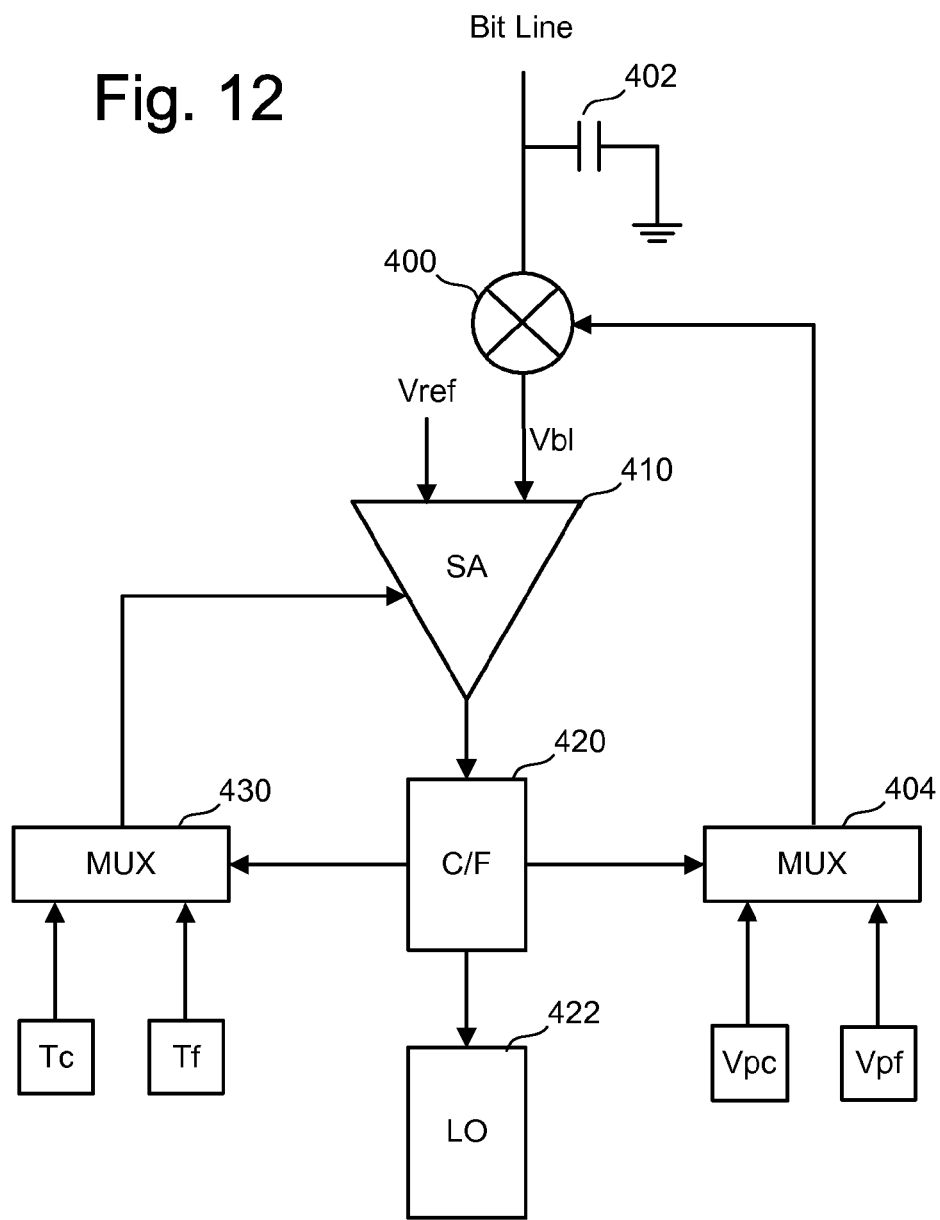
FIG. 12 is a block diagram of components used to verify a non-volatile memory cell.

FIG. 12 is a block diagram depicting components used to implement one embodiment of the process of FIG. 11. FIG. 12 shows a circuit for one bit line. In one embodiment, there would be such a circuit for each bit line. In another embodiment, there would be such a circuit for a pair of bit lines. FIG. 12 shows a bit line connected to switch 400 and capacitor 402. The capacitor is also connected to ground. Switch 400 receives a signal from multiplexer 404. The signal received from multiplexer 404 is used for programming. Multiplexer 404 receives two signals Vpc and Vpf, and chooses between those two signals based on an indication from C/F register 420. Switch 400 is also connected to an input of sense amplification circuit 410. The signal Vref is also connected to an input of sense amplification circuit 410. The output of sense amplification circuit 410 provides data to C/F register 420. The output of C/F register 420 provides data to multiplexer 404, lock out register 422 and multiplexer 430. Multiplexer 430 receives signals Tc and Tf, and chooses between the two signals based on the data from C/F register 420. The output of multiplexer 430 is connected to another input of sense amplification circuit 410.

The operation of the components of FIG. 12 is based on a bit line discharge verification process. First, a bit line is charged. Next, a verification pulse is provided to the control gate (or steering gate) of the memory cell attached to that bit line. The bit line is then allowed to discharge. Based on the rate of discharge, it can be determined whether the memory cell is above or below a particular threshold voltage level.

Figure 13:
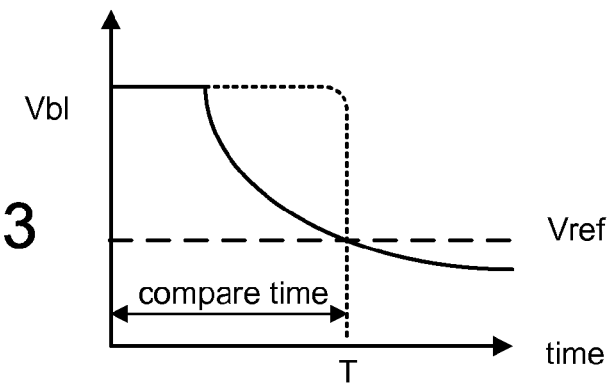
FIG. 13 is a graph of bit line voltage versus time for sensing.

FIG. 13 shows a graph of bit line voltage (Vb1) versus time. In one implementation, the bit lines are allowed to discharge over a period of time T. At time T, the voltage of the bit line is compared against the reference voltage Vref. If the bit line voltage is greater than Vref, then the memory cell has a lower driving capability and is more programmed than the target threshold voltage. If at time T the bit line voltage is less than Vref, then the threshold voltage of the memory cell is less than the target threshold. In another embodiment, instead of measuring the voltage on the bit line after a fixed time T, the bit line can be allowed to discharge until it reaches Vref. Then, this discharge time is compared to a set of predetermined times to determine whether the threshold voltage is above or below the target threshold. In a cell being programmed using the coarse/fine methodology, in one embodiment the compare point can be changed between coarse and fine by having one Vref for coarse and another Vref for fine programming. In an alternative embodiment, the amount of time T can be changed so that there is one time T1 for discharge associated with coarse programming and another time T2 associated with discharging during the fine programming. In another embodiment, the pre-charging the bit line can vary such that there is one pre-charge value used for coarse programming and another pre-charge value used for fine programming. Alternatively, combinations of the above can be used.

In another embodiment, a static sensing approach utilizing current comparators can be utilized. In that embodiment, the fixed reference Vref is replaced with a set of reference currents specific to coarse/fine programming. For a given memory cell, when the reference current exceeds the cell current, the associated sense amplifier will indicate a cell threshold voltage more programmed than the target voltage. Further information can be found in U.S. Pat. No. 6,222,762, which is incorporated herein by reference in its entirety.

In one embodiment of the apparatus depicted in FIG. 12, C/F register 420 is a 1-bit register that indicates whether the particular memory cell is in the coarse programming mode or in the fine programming mode. During programming, if the memory cell is in the coarse programming mode, multiplexer 404 will send the coarse mode programming voltage (Vpc) to the bit line via switch 400. If the memory cell is in the fine programming mode, multiplexer 404 will send the fine mode programming voltage (Vpf) to the bit line via switch 400. During verification, sense amplifier 410 will include a circuit that compares the bit line voltage to the reference voltage Vref. During verification, if the memory cell is in the coarse mode, multiplexer 430 will select the coarse time strobe Tc based on C/F register 420. Sense amplifier 410 will determine whether the bit line discharged to the fixed reference value Vref within the time indicated by Tc. If the sense amplifier determines that the memory cell has passed the coarse verification because the bit line discharged to the fixed reference value Vref within the time indicated by Tc, then a signal will be sent to C/F register 420 to change that register to indicate that the memory cell is now in the fine programming mode. At this point, multiplexers 404 and 430 will then change their selection so that multiplexer 404 will send voltage Vpf to the bit line the next time the cell is programmed, and multiplexer 430 will send time strobe Tf to sense amplifier 410 next time there is a comparison for the verify operation. If, during the fine mode, sense amplification circuit 410 determines that the fine verification process passed successfully because the bit line discharged to the fixed reference value Vref within the time indicated by Tf, then the sense amplifier 410 will so indicate to C/F register 420, which will then cause lock out register 422 to indicate that the cell should be locked out (inhibited) from further programming.

Figure 14:
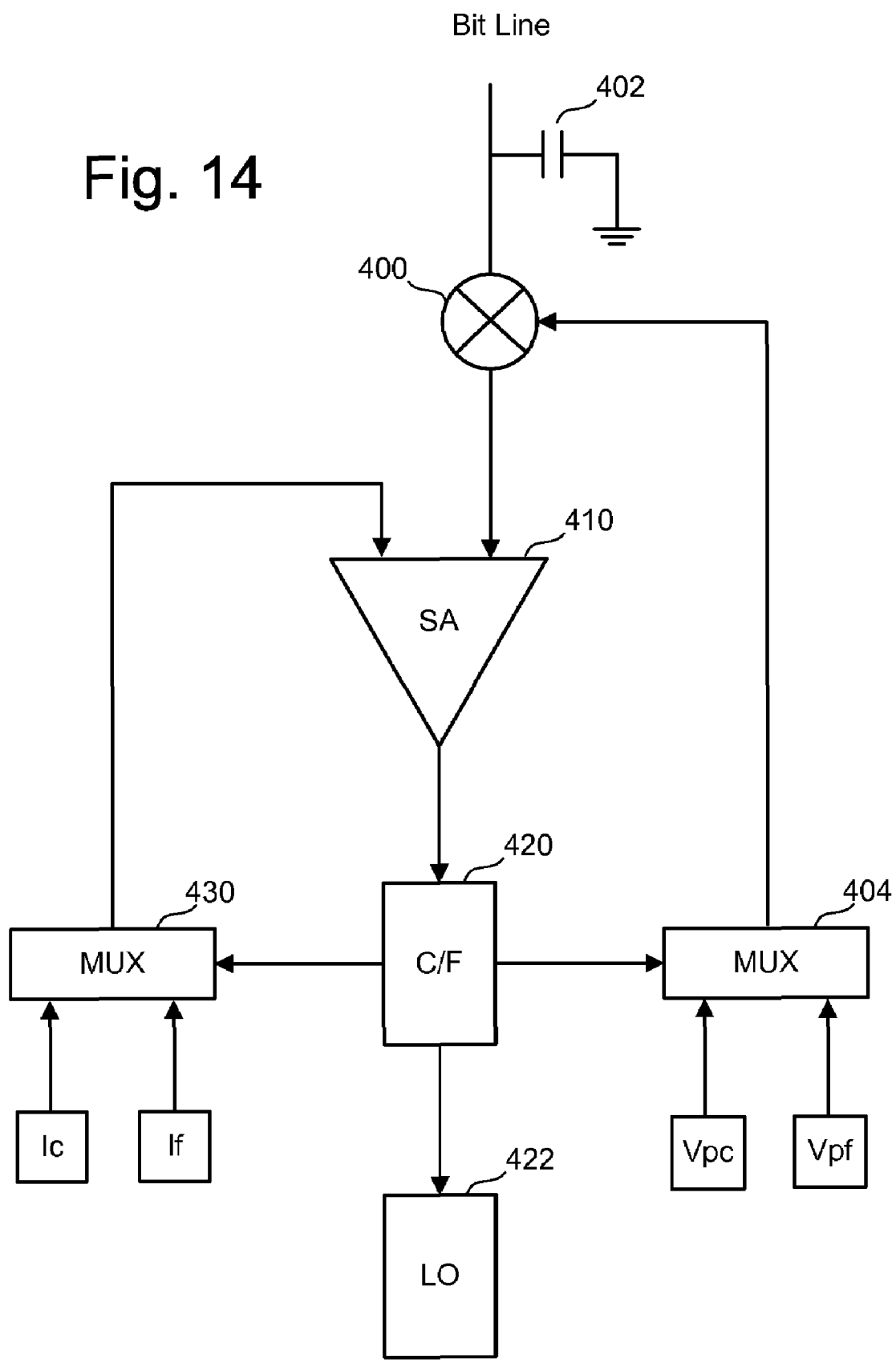
FIG. 14 is an alternative block diagram of components used to verify a non-volatile memory cell.

FIG. 14 is a second embodiment for performing verification. Rather than using a pair of sensing times with a fixed reference voltage for comparing the bit line voltage, a pair of reference current sources are used. For a given memory cell, when the reference current exceeds its cell current, the associated sense amplifier will indicate such a condition, reflecting that the memory cell is programmed to meet the target threshold condition. Thus, multiplexer 430 will select, based on the output of C/F register 420, whether to provide the current source for the coarse phase (Ic) or the current source of the fine phase (If).

Figure 15:
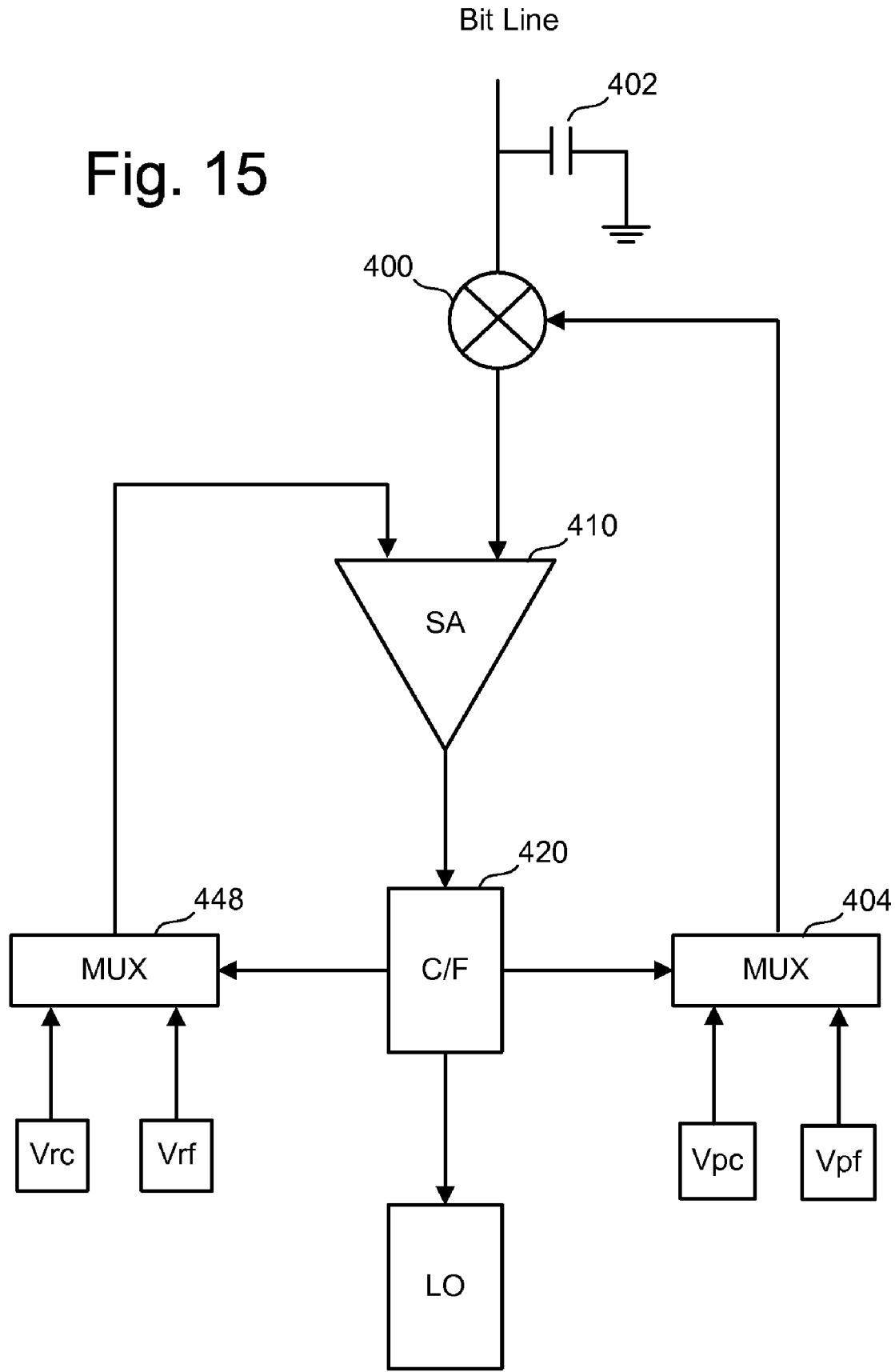
FIG. 15 is an alternative block diagram of components used to verify a non-volatile memory cell.

FIG. 15 depicts another alternative embodiment. In FIG. 15, multiplexer 448 will select either a reference voltage for the coarse programming phase (Vrc) or the reference voltage for the fine programming phase (Vrf) to provide to sense amplifier 410. In this embodiment, sense amplifier 410 will compare the voltage on the discharging bit line after a fixed period of time (T) to the voltage reference received from multiplexer 448, based in turn on C/F register 420.

VI. Current Sinking

As described above, one method for transitioning a memory cell from the coarse programming mode to the fine programming mode is to raise the voltage on the bit line. Raising the voltage on the bit line tends to slow down the programming. Thus, the threshold voltage for memory cells in the fine programming mode will be raised in smaller increments, and a tighter threshold voltage distribution can be achieved. Another means for transitioning a memory cell from the coarse programming phase to the fine programming phase is to change the amount of current through the channel of the memory cell. During programming, the source of the memory cell will rise above ground, as governed by the select gate's conduction characteristics. A current sink can be connected to the source to control how much current will flow through the channel. The greater the sinking current, the greater the current through the channel and the faster the memory cell will program. As the current sink is lowered (sinking less current), then the current in the channel will drop and the memory cell will program more slowly. For example, if the current sink is sinking 1000 nA during the coarse phase and then sinks 100 nA during the fine phase, the channel current will drop to $1/10^{th}$ of its original value and the memory cell will program about ten times slower.

Figure 16:
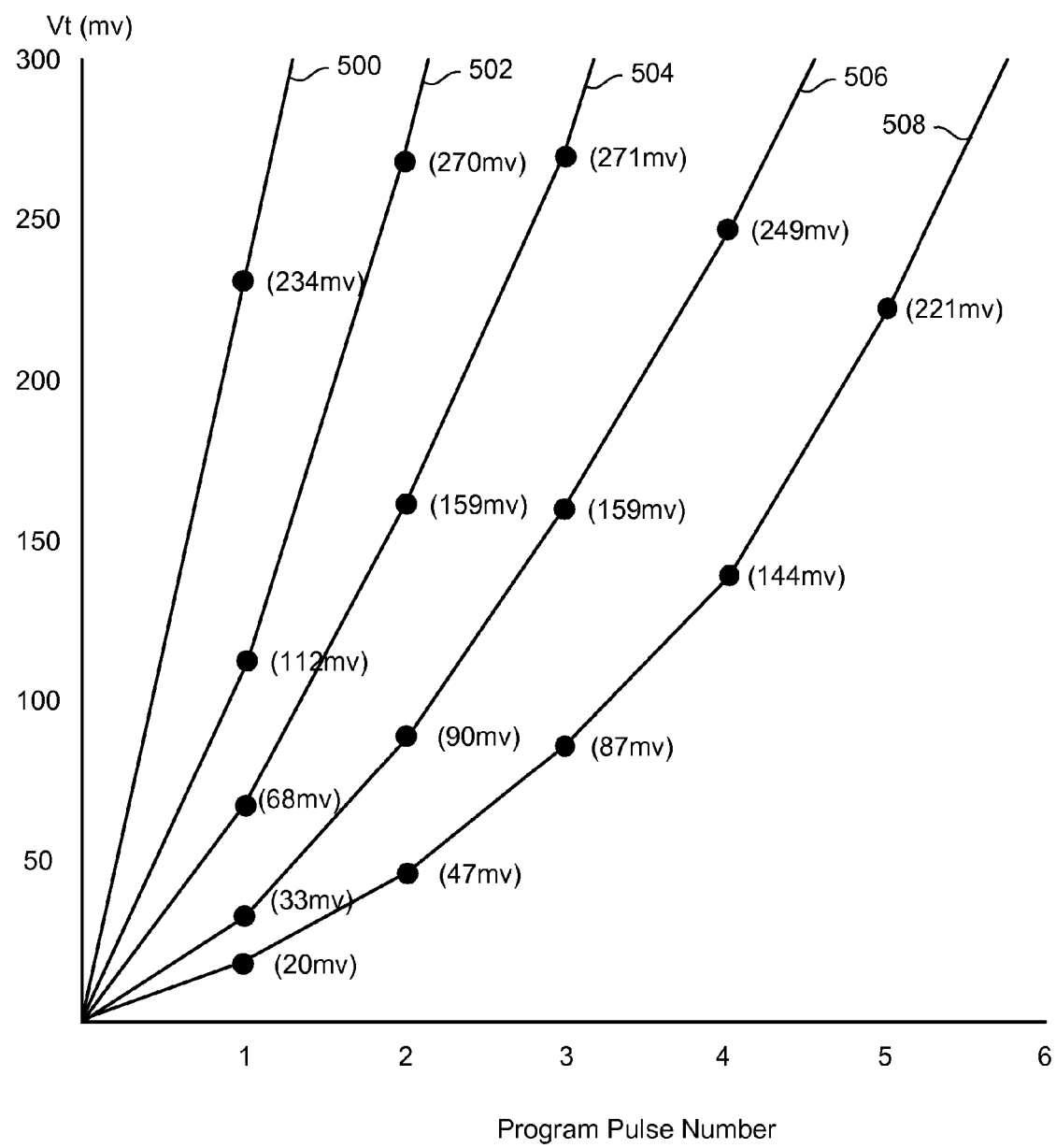
FIG. 16 is a graph of threshold voltage versus program pulse.

FIG. 16 is a graph of relative threshold voltage increase (Vt) versus staircase control gate program pulses, following a series of 250 mV staircase control gate programming pulses with 1000 nA current sinking, thereby setting up a steady state programming condition. FIG. 16 shows five programming curves 500, 502, 504, 506 and 508 for a memory cell programmed using different current sinks. The memory cell associated with graph 500 has a current sink of 1,000 nA, continuing the steady state programming operation. The memory cell associated with curve 502 has a current sink dropped to 562 nA. The memory cell associated with curve 504 has a current sink dropped to 316 nA. The memory cell associated with curve 506 has a current sink dropped to 178 nA. The memory cell associated with curve 508 has a current sink dropped to 100 nA. As can be seen from the graphs of FIG. 16, the greater the current sink the faster the memory cell will program. For example, after a first program pulse, the memory cell associated with curve 508 has its threshold voltage increased by 20 mv, the memory cell associated with curve 506 has its threshold voltage increased by 33 mv, the memory cell associated with curve 504 has its threshold voltage increased by 68 mv, the memory cell associated with curve 502 has its threshold voltage increased by 112 mv and the memory cell associated with curve 500 has its threshold voltage increased by 234 mv, reflecting the steady state response to the 250 mV per step control gate programming staircase. After the second programming pulse, the memory cell associated with curve 508 has a threshold voltage of 47 mv, the memory cell associated with curve 506 has a threshold voltage of 90 mv, the memory cell associated with curve 504 has a threshold voltage of 159 mv and the memory cell associated with curve 502 has a threshold voltage of 270 mv. After the third programming pulse, the threshold voltage of the memory cell associated with curve 508 is 87 mv, the threshold voltage of memory cell associated with curve 506 is 159 mv and the threshold voltage of the memory cell associated with curve 504 is 271 mv. After the fourth programming step, the memory cell associated with step 508 has a threshold voltage of 144 mv and the memory cell associated with the curve 506 has a threshold voltage of 249 mv. At the fifth programming step, the threshold voltage of the memory cell associated with curve 508 is 221 mv.

Consequently, as described for FIG. 16, by lowering the amount of current sinking, the rate of programming can be slowed down. Thus, in one embodiment, change between two current sinks is used to change between coarse and fine modes. For example, a coarse mode can have a large current sink (e.g., 1000 nA) and a fine mode can have a smaller current sink (e.g., 100 nA). Alternatively, the coarse mode can have no current sink, while the fine mode has a current sink to reduce the speed of programming. Other configurations can also be used.

Figure 17:
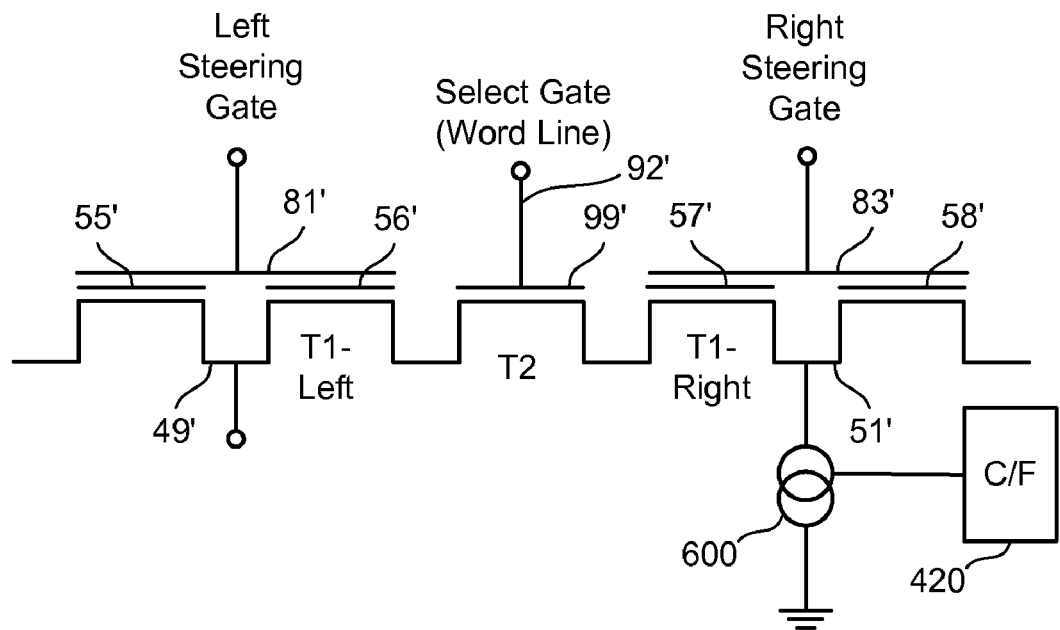
FIG. 17 is a schematic of non-volatile memory using a first embodiment of current sinking.

FIG. 17 depicts a memory element according to the schematic of FIG. 7, with the addition of current sink 600 connected to the right bit or control line (BL right, terminal 51'). In the implementation of FIG. 17, floating gate 56' is being programmed. In some embodiments, the control lines at 51' and 49' are both considered bit lines. In other embodiments, the control line at terminal 51' could be considered a source line or a different control line. Current sink 600 is connected to C/F register 420 (described above). In one embodiment, current sink 600 is a variable current sink. That is, current sink 600 can sink different levels of current. For example, current sink can sink two different levels of current, one level for the fine mode and another level for the coarse mode. Based on the indication from C/F register 420, the appropriate current sink value will be selected. For example, if C/F register 420 indicates that the floating gate 56' is in the coarse mode, then the appropriate current sink for the coarse mode will be selected by current sink 600. If C/F register 420 indicates at floating gate 56' is in the fine mode, then current sink 600 will select the appropriate sink value for the fine mode. In another embodiment, current sink 600 will only be used to sink current for the fine mode and there will be a switch between terminal 51' and ground supply to bypass current sink 600 during coarse mode. That switch would be controlled based on the value stored in C/F register 420. In the embodiment of FIG. 17, the program voltage (e.g., the staircase control gate programming voltage described above), is applied to the left steering gate 81'.

In another embodiment, current sink 600 of FIG. 17 is a variable current sink that can sink different sets of coarse and fine values for each state of a multistate memory cell. For example, if there were seven programmed states, current sink 600 would be able to sink fourteen (or less if there is overlap) different levels of current. Alternatively, there can be fourteen (or less if there is overlap) different current sinks. Employing different sets of current sink values for different states allows the programming process to be more efficient so that less programming pulses are needed (e.g., 200 mV step size) and the more heavily programmed memory cells (e.g., being programmed to state 7 ) will program faster without causing the cells that are targeted to be programmed to lower states (e.g. being programmed to state 1 ) to be over programmed. One implementation of the above described scheme, may verify against all states after each programming pulse, rather than using the Smart Verify Scheme mentioned above.

The table below provides an example set of current sink values. Note that two options are provided for the fine mode. A circuit designer designing the fine mode can choose either option depending on how much the designer wishes to slow down the programming in the fine mode, with Option 2 corresponding to a stronger slowing down of programming when transitioning from coarse to fine mode.

| | | Assuming a state-to-state separation of 500 mV | | |
|---|---|---|---|---|
| State | VT | Coarse Current Sink Value (nA) | Fine Current Sink Value (Option 1) (nA) | Fine Current Sink Value (Option 2) (nA) |
| 7 | 3.5 | 1000.19 | 409.67 | 167.79 |
| 6 | 3.0 | 409.67 | 167.79 | 68.73 |
| 5 | 2.5 | 167.79 | 68.73 | 28.15 |
| 4 | 2.0 | 68.73 | 28.15 | 11.53 |
| 3 | 1.5 | 28.15 | 11.53 | 4.72 |
| 2 | 1.0 | 11.53 | 4.72 | 1.93 |
| 1 | 0.5 | 4.72 | 1.93 | 0.79 |

State-to-state separations can be reduced to the same extent that programming distributions can be tightened, keeping the state-to-state margin the same of any two schemes that are compared. To this end, the next table depicts the range of necessary constant currents sink values to program seven states with a state-to-state separation of 400 mV.

| | | Assuming a state-to-state separation of 400 mV | | |
|---|---|---|---|---|
| State | VT | Coarse Current Sink Value (nA) | Fine Current Sink Value (Option 1) (nA) | Fine Current Sink Value (Option 2) (nA) |
| 7 | 2.8 | 1000.15 | 489.71 | 239.78 |
| 6 | 2.4 | 489.71 | 239.78 | 117.40 |
| 5 | 2.0 | 239.78 | 117.40 | 57.48 |
| 4 | 1.6 | 117.40 | 57.48 | 28.14 |
| 3 | 1.2 | 57.48 | 28.14 | 13.78 |
| 2 | 0.8 | 28.14 | 13.78 | 6.74 |
| 1 | 0.4 | 13.78 | 6.74 | 3.30 |

Note that the above sets of current sink values are for example purposes and many other different values can also be used depending on the particular implementation. Further note that many of the values used for current sinking in the fine mode are the same as current sink values used in the coarse mode for a different state. For example, the current sink value for state 5 of the fine mode (Option 1) and the current sink value for state 4 of the coarse mode are both 117.40 nA. This overlap can reduce the logic needed to implement this feature and, in some cases, the number or current sinks or the complexity of the current sink(s).

Figure 18:
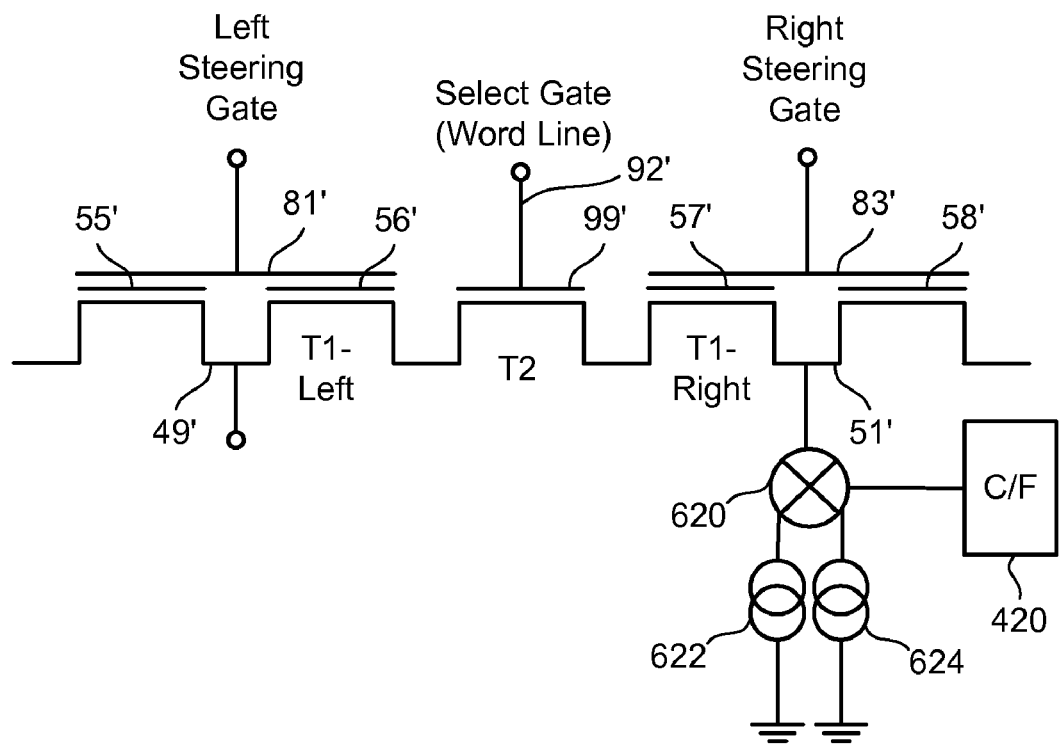
FIG. 18 is a schematic of non-volatile memory using a second embodiment of current sinking.

FIG. 18 graphically depicts an alternative embodiment where the C/F register 420 is used to control switch 620. Switch 620 selects between two current sinks 622 and 624. Current sink 622 sinks current for the coarse mode and current sink 624 sinks current for the fine mode. If C/F register 420 indicates that floating gate 56' is being programmed in the coarse mode, then it will send a signal to switch 628 to choose current sink 622. If floating gate 56' is being programmed in the fine mode, then C/F register 420 will indicate to switch 620 to choose current sink 624. Thus, switching from coarse programming mode to fine programming mode is performed by switching current sinks. It is contemplated that current sink 624 for fine mode will sink less current than current sink 622 for coarse mode.

Figure 19:
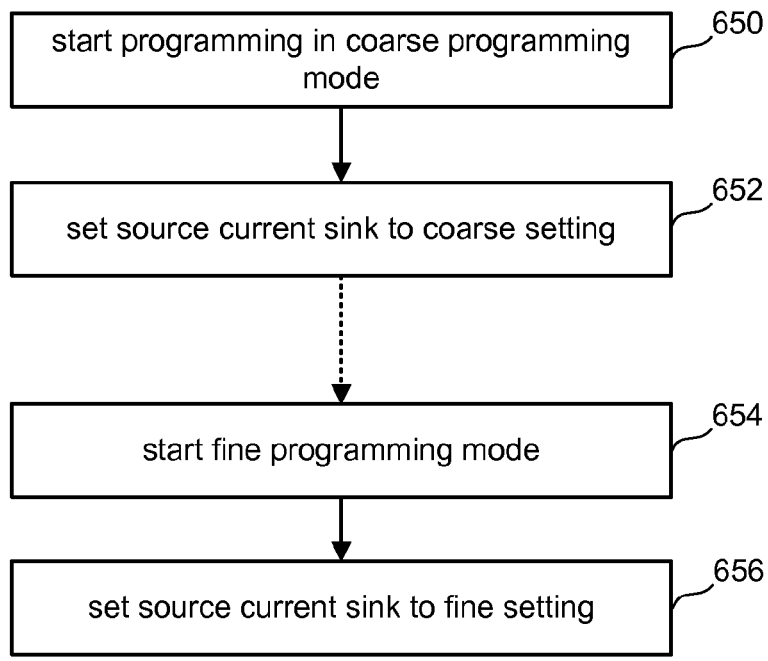
FIG. 19 is a flow chart describing one embodiment of a coarse/fine programming process that uses current sinking.

FIG. 19 is a flow chart describing a process using the current sinking technology described herein. In step 650, the memory cell will start programming in the coarse programming mode. The coarse programming mode will continue until the first threshold voltage verify level is reached. In order to perform the coarse programming mode, the current sink mechanism will be set to the coarse mode current sinking setting in step 652. In some embodiments, no current sinking will be used in the coarse mode. Step 652 can include appropriately controlling current sink 600 in FIG. 17 or selecting current sink 622 in FIG. 18. Step 650 and step 652 will continue until the coarse mode is completed (which is why the arrow below step 652 is dotted). When the coarse mode is completed because the coarse verification level has been reached, fine programming mode will begin in step 654. As part of the fine programming mode, the current sink will be set to the fine mode current sinking setting in step 656. In one embodiment, step 656 includes appropriately setting current sink 600 in FIG. 17. In another embodiment, step 656 includes selecting current sink 624 in FIG. 18. The process of FIG. 19 is for one memory cell. It is contemplated that multiple memory cells will be performing the process of FIG. 19 concurrently, with some memory cells in the coarse programming mode while others are in the fine programming mode.

The process of FIG. 19 concurrently with the current sinking technology described herein can be used in other types of memory cells in addition to those depicted in FIGS. 17 and 18. For example, FIGS. 17 and 18 include dual floating gates per memory cell. The current sinking technology as described herein can be used in a memory cell with only one floating gate, in which case the current sink is preferably connected to the source side of the one floating gate. The current sinking technology can also be used in memory cells with more than two floating gates. Typically, the current sink will be applied to a source side with respect to a floating gate being programmed. However, in other embodiments it can be connected to other control lines which thereby govern programming speed. For example, the designation of source and drain can be arbitrary in some structures and thus the invention is not limited to the "source" side.

Note that the use of current sinks for coarse/fine programming, described above, can be combined with the concurrent coarse/fine verification process described earlier. In alternative modes, the current sink process for entering fine mode versus coarse mode can be used without the concurrent coarse/fine verification process described earlier. Additionally, the current sink technology described herein (in combination with the concurrent coarse/fine verification or without the concurrent coarse/fine verification) can be used with or without the Smart Verify process described earlier. Additionally, the Smart Verify process can also be used with the concurrent coarse/fine verification process, without using the current sinking to change between coarse/fine.

VII. Charge Packet Metering

Figure 20:
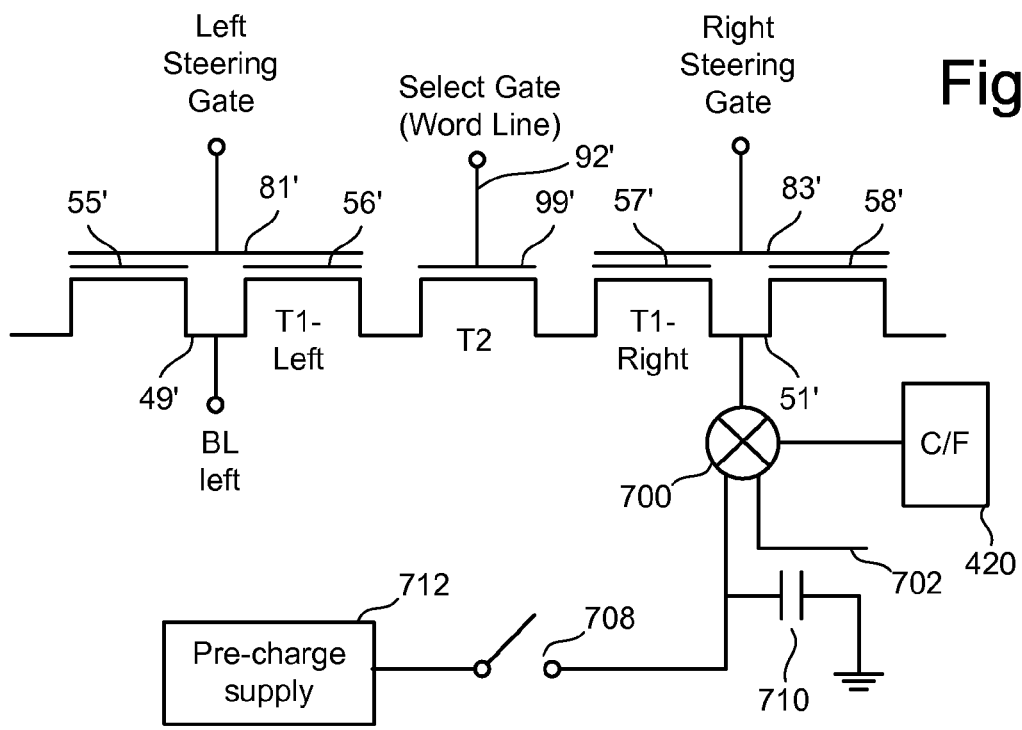
FIG. 20 is a schematic of non-volatile memory using a first embodiment of charge packet metering.

Another set of embodiments for causing a memory cell to enter a fine programming mode is described with respect to FIGS. 20-25. These embodiments provide for a fine programming mode by limiting the charge available for programming a memory cell. For example, FIG. 20 shows the memory cell of FIG. 7 in a configuration where floating gate 56' is being programmed. Attached to bit line right terminal 51' is a switch 700 that is controlled by C/F register 420. Switch 700 has two inputs. The first input is labeled by reference number 702. When C/F register 420 indicates that the floating gate 56' is in the coarse mode, the switch 700 will select input 702 which will be the normal components connected to the bit line during the coarse programming mode. That is, during coarse programming mode, in one embodiment, there is no charge packet metering. If floating gate 56' is in the fine programming mode, as indicated by C/F register 420, switch 700 will connect terminal 51' to switch 708 and capacitor 710. The opposite side of capacitor 710 is connected to a reference potential (e.g. ground). Switch 708 is connected to a pre-charge supply (e.g., voltage supply) 712. Components 708, 710 and 712 are used for the fine programming mode as part of a two step method. In the first step, capacitor 710 is connected to power supply 712 via switch 708 and charged to a pre-charge voltage, the programming source bias. In the second step, capacitor 710 is disconnected from voltage supply 712 followed by a control gate programming voltage pulse applied to the left steering gate 81'. The pre-charge voltage stored in capacitor 710 is discharged via current passed through the memory cell, and electrons are injected into floating gate 56'. When the capacitor is sufficiently discharged, hot electron injection stops and programming ceases. Thus, the relative amount of charge stored on the capacitor 710 limits how much programming occurs. Less relative charge on the capacitor means that the threshold voltage will move a smaller amount. For example, a capacitor which is twice as large (e.g. 2C) pre-charged to the same voltage value stores twice the relative charge and programs twice as much as a capacitor with capacitance of C pre-charged to the same voltage value. FIG. 20 shows the components 420 and 700-712 for one bit line. In one embodiment, there is a similar set of components for each bit line.

Figure 21:
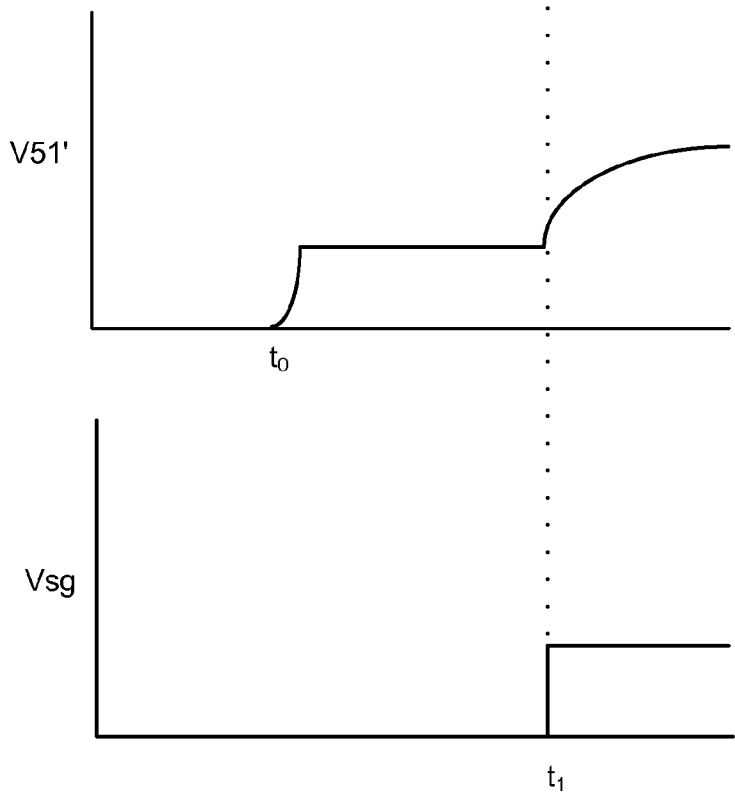
FIG. 21 depicts graphs of voltage versus time.

FIG. 21 provides two graphs. The upper graph shows the voltage at terminal 51' versus time. The lower graph shows the voltage at the select gate versus time. At time $t_0$, capacitor 710 is pre-charged, thus pre-charging the control line at terminal 51'. When the select gate turns on at time $t_1$, capacitor 710 of FIG. 20 will start sinking current, and its voltage will rise, reducing current flow. Eventually, the current in the channel stops flowing when the capacitor is sufficiently discharged.

Figure 22:
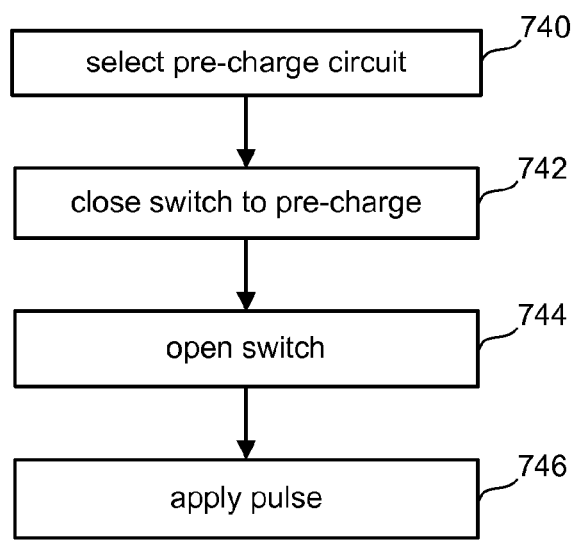
FIG. 22 is a flow chart describing one embodiment of a coarse/fine programming process that uses charge packet metering.

FIG. 22 is a flow chart describing one embodiment of a process for performing the charge metering described above. In step 740, the appropriate pre-charge circuit is selected. In one embodiment, there is only a pre-charge circuit for the fine mode with no pre-charge circuit for the coarse mode. Further embodiments, can use a first pre-charge circuit for coarse mode and a second pre-charge circuit for fine mode. In step 742 the switch that allows pre-charging (e.g. switch 708) is closed to start the pre-charging. In step 744, the switch is opened, which ends the pre-charging. In step 746, the pulse supplied to the steering gate is applied and the select gate is turned on so that current flows through the channel and electrons are injected into the floating gate until the capacitor is sufficiently discharged.

Figure 23:
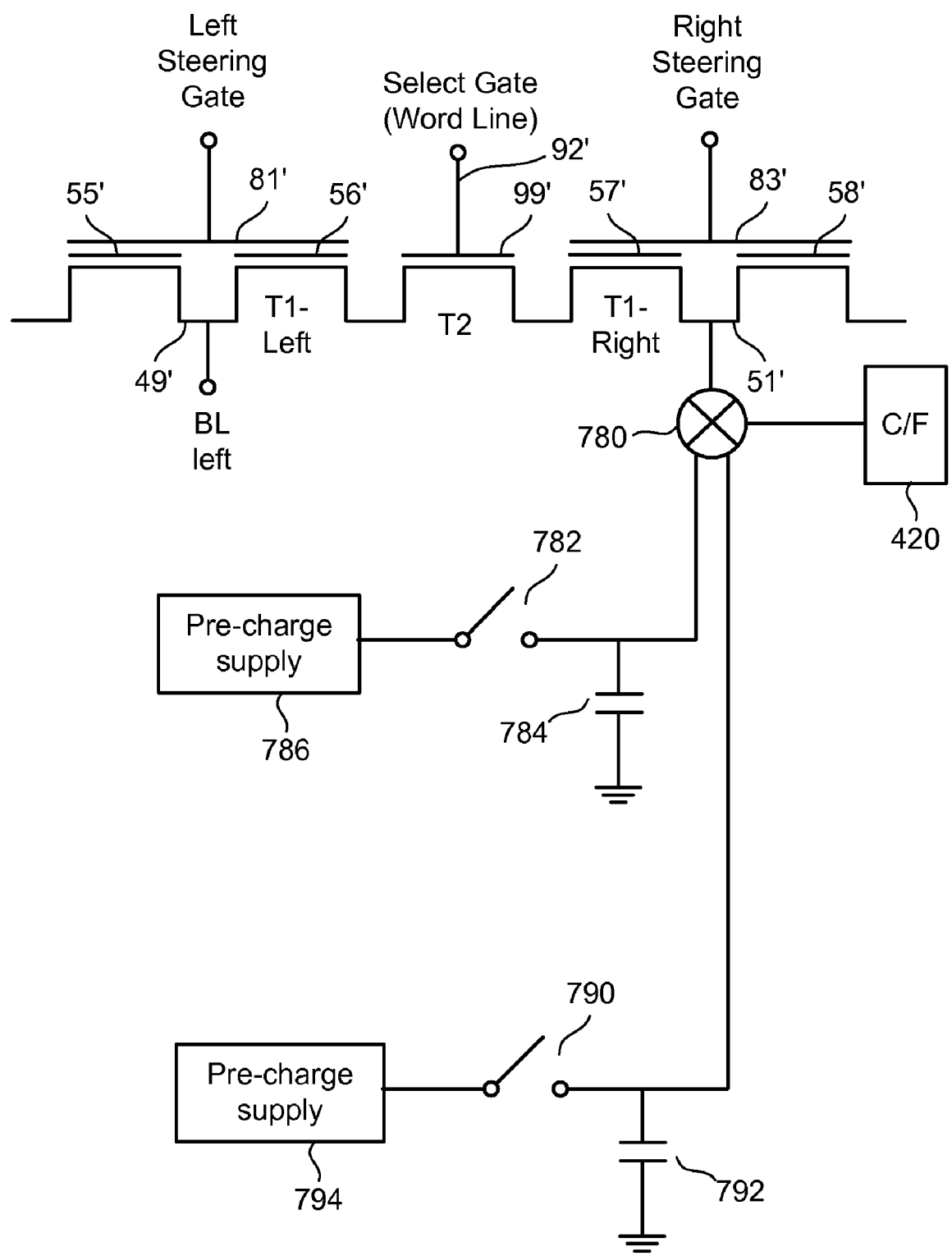
FIG. 23 is a schematic of non-volatile memory using a second embodiment of charge packet metering.

FIG. 23 provides a block drawing of an alternative embodiment which uses one pre-charge circuit for the course programming mode and another pre-charge circuit for the fine programming mode. Switch 780 is connected to terminal 51' and is controlled by C/F register 420. If C/F register 420 indicates that the floating gate 56' is in the coarse programming mode, switch 780 will select components 782, 784 and 786. If C/F register 420 indicates that the floating gate 56' is in the fine programming mode, then switch 780 will select components 790, 792 and 794.

Pre-charge supply 786 is connected to switch 782, which is connected to capacitor 784. When switch 782 is closed, pre-charge supply 786 charges capacitor 784 for the coarse programming mode. After charging capacitor 784, switch 782 is opened and capacitor 784 is allowed to discharge (via switch 780) through the memory cell to program floating gate 56'.

Pre-charge supply 794 is used to pre-charge capacitor 792 when switch 790 is closed. After pre-charging capacitor 792, switch 790 is opened, thereby allowing capacitor 792 to discharge through the memory cell during the fine programming mode in order to program floating gate 56'. In one embodiment, pre-charge supply 786 will be at a lower voltage than pre-charge supply 794 so that capacitor 784 is charged to a relatively larger value for the coarse programming mode than is capacitor 792 for the fine programming mode. The greater the value of the charge on the capacitor, the more programming that will take place. Thus, more programming can be allowed for the coarse mode and less programming can be allowed for the fine mode. The exact values of the supply (voltage or other type of supply) and the capacitors are determined based on specific requirements and device optimization, simulation, and/or device characterization, as well as the targets for differentiating coarse versus fine programming.

Figure 24:
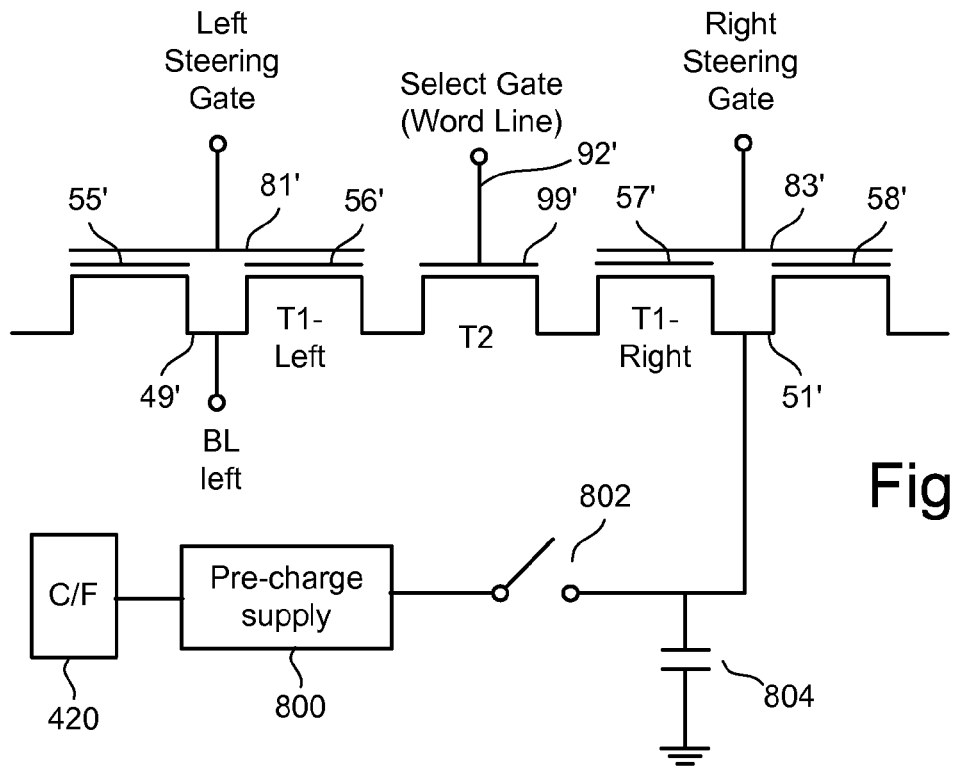
FIG. 24 is a schematic of non-volatile memory using a third embodiment of charge packet metering.

FIG. 24 provides an alternative embodiment for metering the charge within the memory cell. FIG. 24 shows C/F register 420 connected to a variable pre-charge supply 800. Pre-charge supply 800 can supply at least two different supply levels, one level for coarse programming mode and another level for fine programming mode. Based on the value in C/F register 420, the appropriate level is supplied to switch 802. Switch 802 is also connected to capacitor 804 and terminal 51'. Thus, during the coarse programming phase, pre-charge supply 800 will be used to send a coarse charging level to capacitor 804 for programming floating gate 56'. During fine programming mode, pre-charge supply 800 will provide a fine charge (of less relative magnitude than the coarse charge) for programming floating gate 56'.

Figure 25:
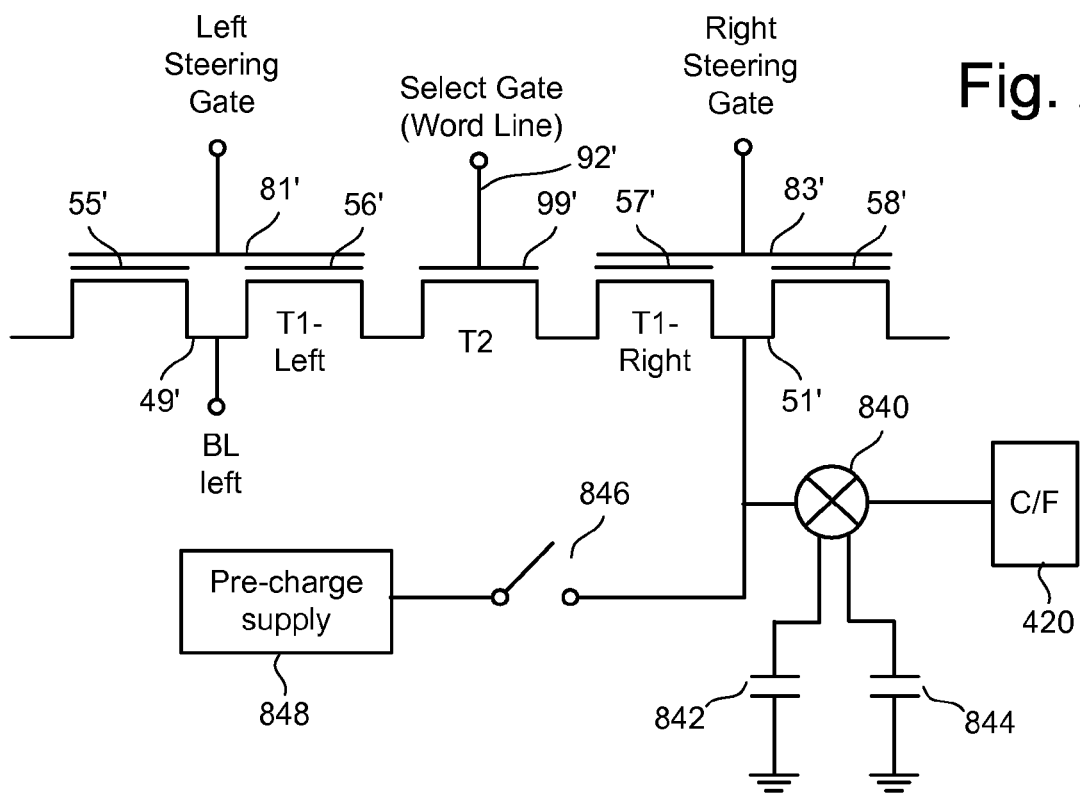
FIG. 25 is a schematic of non-volatile memory using a fourth embodiment of charge packet metering.

FIG. 25 provides yet another alternative embodiment for charge metering as described above. The embodiment of FIG. 25 includes using a common pre-charge supply 848 for both coarse and fine modes. However, switch 840 is used to select between two different capacitors. Capacitor 842 is used for programming during the coarse mode and capacitor 844, which has smaller capacitance than that of capacitor 842, is used for programming during the fine mode. Switch 840 selects between capacitor 842 and 844 based on the value stored in C/F register 420.

Note that in some embodiments, pre-charging the control line (e.g. 51') using the capacitor would bring the control line to ground. When the pulse is supplied to the steering gate, the pre-charge causes sinking of a current to the capacitor, and the voltage will rise until the device ultimately shuts itself down. As current flows into the capacitor, the voltage at terminal 51' will increase until it reaches a sufficiently high value to effectively stop programming. This charge limited operation is performed for each pulse during programming.

After each pulse is applied, the memory cell is verified. The charge packet metering technology described above can optionally be used in combination with Smart Verify process and/or the concurrent coarse/fine verify process described above.

Note that in some embodiments the concurrent coarse/fine verification, current sinking during programming and charge metering during programming all contemplate a common signal (e.g. Vpgm staircase) being provided to the word line or steering gates (depending on the memory cell structure) for multiple memory cells.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus for programming non-volatile storage elements, comprising:
   means for providing a programming signal to said non-volatile storage elements as part of a programming process that includes a coarse programming phase and a fine programming phase such that one or more of said non-volatile storage elements are in said coarse programming phase while one or more of said non-volatile storage elements are in said fine programming phase, said non-volatile storage elements are part of a common memory array;
   means for performing coarse verification for said one or more non-volatile storage elements that are in said coarse programming phase without performing fine verification for said one or more non-volatile storage elements that are in said coarse programming phase; and
   means for performing fine verification for said one or more non-volatile storage elements that are in said fine programming phase without performing coarse verification for said one or more non-volatile storage elements that are in said fine programming phase.

2. An apparatus according to claim 1, wherein:
   said means for performing coarse verification performs said coarse verification for said one or more non-volatile storage elements that are in said coarse programming phase while concurrently said means for performing fine verification performs said fine verification for said one or more non-volatile storage elements that are in said fine programming phase.

3. An apparatus according to claim 1, wherein:
   said means for performing coarse verification and said means for performing fine verification utilize a bit line discharge verification process.

4. An apparatus according to claim 1, wherein:
   said non-volatile storage elements are multi-state flash memory devices.

5. An apparatus as recited in claim 1, wherein said means for providing a common programming signal includes a programming circuit in communication with said non-volatile storage elements and includes a common control line connected to said non-volatile storage elements and in communication with said programming circuit.

6. An apparatus as recited in claim 1, wherein said means for providing a common programming signal to said non-volatile storage elements as part of a programming process includes a means for programming said non-volatile storage elements together, said programming process is a common coarse/fine programming process.

7. A method performed when programming non-volatile storage elements, comprising:
   determining whether said non-volatile storage elements are in a coarse programming mode or a fine programming mode including determining whether one or more of said non-volatile storage elements are in said coarse programming mode while one or more of said non-volatile storage elements are in said fine programming mode and determining whether one or more of said non-volatile storage elements are in said fine programming mode while one or more of said non-volatile storage elements are in said coarse programming mode, said non-volatile storage elements have a common programming signal and are part of a common memory array;
   providing said common programming signal on a common control line that is in communication with said non-volatile storage elements;
   performing coarse verification for said non-volatile storage elements without performing fine verification for said non-volatile storage elements, if said non-volatile storage elements are determined to be in said coarse programming mode; and
   performing fine verification for said non-volatile storage elements without performing coarse verification for said non-volatile storage element, if said non-volatile storage elements are determined to be in said fine programming mode.

8. A method according to claim 7, wherein:
   said coarse verification and said fine verification are based on a bit line discharge process.

9. A method according to claim 7, wherein:
   said non-volatile storage elements are flash memory device.

10. A method according to claim 7, wherein:
    said non-volatile storage elements are multi-state flash memory devices.

11. A method according to claim 7, wherein:
    said step of determining is based on stored data obtained from one or more storage devices, said data indicates whether said non-volatile storage elements are in said coarse programming mode or said fine programming mode.

12. A method according to claim 7, further including the steps of:
    selecting a coarse reference signal if said non-volatile storage elements are determined to be in said coarse programming mode, said coarse reference signal is used during said coarse verification; and
    selecting a fine reference signal if said non-volatile storage elements are determined to be in said fine programming mode, said fine reference signal is used during said fine verification.

13. A method according to claim 7, wherein:
    said coarse verification is performed if said non-volatile storage elements are determined to be in said coarse programming mode while concurrently a fine verification process is performed for one or more other non-volatile storage elements; and
    said fine verification is performed if said non-volatile storage elements are determined to be in said fine programming mode while concurrently a coarse verification process is performed for one or more other non-volatile storage elements.

14. A method according to claim 7, wherein:
    said coarse verification and said fine verification perform a bit line discharge analysis based on timing information.

15. A method according to claim 7, wherein:
    said coarse verification and said fine verification perform a bit line discharge analysis based on discharge voltage information.

16. A method according to claim 7, wherein:
    said coarse verification and said fine verification perform a bit line discharge analysis based on a current value of said non-volatile storage elements.

17. A method for programming non-volatile storage elements, comprising:
    providing a common programming signal to said non-volatile storage elements, said providing a common programming signal includes programming said non-volatile storage elements as part of a programming process that includes a coarse programming phase and a fine programming phase such that one or more of said non-volatile storage elements are in said coarse programming phase while one or more of said non-volatile storage elements are in said fine programming phase, said programming process is a common coarse/fine programming process;

performing coarse verification for said one or more non-volatile storage elements that are in said coarse programming phase without performing fine verification for said one or more non-volatile storage elements that are in said coarse programming phase; and performing fine verification for said one or more non-volatile storage elements that are in said fine programming phase without performing coarse verification for said one or more non-volatile storage elements that are in said fine programming phase.

18. A method according to claim 17, wherein:
said non-volatile storage elements are multi-state flash memory devices.

19. A method according to claim 18, wherein:
said coarse verification is performed for a particular state of said non-volatile storage elements without performing fine verification for said state if said non-volatile storage elements are determined to be in said coarse programming phase; and
said fine verification is performed for said state of said non-volatile storage elements without performing coarse verification for said state if said non-volatile storage elements are determined to be in said fine programming phase.

20. A method according to claim 18, wherein:
said coarse verification is performed for a particular state of said non-volatile storage elements if said non-volatile storage elements are determined to be in said coarse programming phase while concurrently a fine verification process is performed for said particular state of one or more other non-volatile storage elements; and
said fine verification is performed for said particular state of said non-volatile storage elements if said non-volatile storage elements are determined to be in said fine programming phase while concurrently a coarse verification process is performed for said particular state of one or more other non-volatile storage elements.

21. A method according to claim 17, wherein:
said step of performing coarse verification for said one or more non-volatile storage elements includes determining that said one or more non-volatile storage elements are in said coarse programming phase based on information stored on a storage device; and
said step of performing fine verification for said one or more non-volatile storage elements includes determining that said one or more non-volatile storage elements are in said fine programming phase based on said information stored on said storage device.

22. A method according to claim 17, further comprising the step of:
updating a storage device based on said coarse verification and said fine verification, said storage device stores information indicating whether said non-volatile storage elements are in said coarse programming phase or said fine programming phase.

23. A method according to claim 17, wherein:
said coarse verification is performed if said non-volatile storage elements are in said coarse programming phase while concurrently a fine verification process is performed for one or more other non-volatile storage elements; and
said fine verification is performed if said non-volatile storage elements are in said coarse programming phase while concurrently a coarse verification process is performed for one or more other non-volatile storage elements.

24. A method as recited in claim 17, wherein said providing a common programming signal includes providing said common programming signal on a common control line that is in communication with the non-volatile storage elements.

25. A method as recited in claim 17, wherein said non-volatile storage elements are part of a common memory array.

26. A method for programming non-volatile storage elements, comprising:
providing a common programming signal to said non-volatile storage elements as part of a programming process that includes a coarse programming phase and a fine programming phase such that one or more of said non-volatile storage elements are in said coarse programming phase while one or more of said non-volatile storage elements are in said fine programming phase, said non-volatile storage elements are part of a common memory array;
performing coarse verification for said one or more non-volatile storage elements that are in said coarse programming phase without performing fine verification for said one or more non-volatile storage elements that are in said coarse programming phase; and
performing fine verification for said one or more non-volatile storage elements that are in said fine programming phase without performing coarse verification for said one or more non-volatile storage elements that are in said fine programming phase.

27. A method for programming non-volatile storage elements, comprising:
providing a common programming signal to said non-volatile storage elements as part of a programming process that includes a coarse programming phase and a fine programming phase such that one or more of said non-volatile storage elements are in said coarse programming phase while one or more of said non-volatile storage elements are in said fine programming phase, said providing a common programming signal includes providing said common programming signal on a common control line that is in communication with the non-volatile storage elements said non-volatile storage elements are part of a common memory array;
performing coarse verification for said one or more non-volatile storage elements that are in said coarse programming phase without performing fine verification for said one or more non-volatile storage elements that are in said coarse programming phase; and
performing fine verification for said one or more non-volatile storage elements that are in said fine programming phase without performing coarse verification for said one or more non-volatile storage elements that are in said fine programming phase.

* * * * *